(12) United States Patent
Fong et al.

(10) Patent No.: US 8,334,025 B2
(45) Date of Patent: *Dec. 18, 2012

(54) ANTIMONY-FREE PHOTOCURABLE RESIN COMPOSITION AND THREE DIMENSIONAL ARTICLE

(75) Inventors: John Wai Fong, Temple City, CA (US); Richard N. Leyden, Topanga, CA (US); Laurence Messe, Blotzheim (FR); Ranjana C. Patel, Little Hallingbury (GB); Carole Chapelat, Saint-Louis (FR)

(73) Assignee: 3D Systems, Inc., Rock Hill, SC (US)

( * ) Notice: Subject to any disclaimer, the term of this patent is extended or adjusted under 35 U.S.C. 154(b) by 539 days.

This patent is subject to a terminal disclaimer.

(21) Appl. No.: 12/092,490

(22) PCT Filed: Oct. 26, 2006

(86) PCT No.: PCT/EP2006/067804
§ 371 (c)(1),
(2), (4) Date: Sep. 17, 2009

(87) PCT Pub. No.: WO2007/048819
PCT Pub. Date: May 3, 2007

(65) Prior Publication Data
US 2010/0015408 A1    Jan. 21, 2010

Related U.S. Application Data

(60) Provisional application No. 60/730,931, filed on Oct. 27, 2006, provisional application No. 60/795,521, filed on Apr. 27, 2006, provisional application No. 60/795,353, filed on Apr. 27, 2006.

(51) Int. Cl.
| | |
|---|---|
| G03F 7/00 | (2006.01) |
| G03F 7/038 | (2006.01) |
| B22C 7/02 | (2006.01) |
| B29C 67/00 | (2006.01) |
| A61L 27/14 | (2006.01) |
| A61L 29/04 | (2006.01) |
| C09D 11/10 | (2006.01) |
| G09B 23/28 | (2006.01) |

(52) U.S. Cl. ............ 427/466; 430/269; 522/15; 522/25; 522/26; 522/29; 522/107

(58) Field of Classification Search ............... 430/269; 427/466; 522/15, 25, 31, 29, 26, 107
See application file for complete search history.

(56) References Cited

U.S. PATENT DOCUMENTS

| | | | |
|---|---|---|---|
| 4,090,936 A * | 5/1978 | Barton | 430/280.1 |
| 5,605,941 A | 2/1997 | Steinmann et al. | |
| 6,130,025 A | 10/2000 | Chikaoka et al. | |
| 7,964,248 B2 * | 6/2011 | Fong et al. | 427/466 |
| 2003/0198824 A1 | 10/2003 | Fong et al. | |
| 2005/0072519 A1 | 4/2005 | Johnson et al. | |

FOREIGN PATENT DOCUMENTS
WO     WO 03/089991     10/2003

* cited by examiner

Primary Examiner — Susan W Berman

(57) ABSTRACT

The present invention provides a low viscosity photocurable composition including (i) a cationically curable component (ii) a free radically active component (iii) an antimony-free cationic photoinitiator (v) a free radical photoinitiator, and (vi) a toughening agent. The photocurable composition can be cured using rapid prototyping techniques to form three-dimensional articles which can be used in various aerospace and investment casting applications.

30 Claims, No Drawings

ANTIMONY-FREE PHOTOCURABLE RESIN COMPOSITION AND THREE DIMENSIONAL ARTICLE

FIELD OF THE INVENTION

The present invention is directed to a low viscosity photocurable composition comprising (i) a cationically curable component (ii) a free radically active component (iii) an antimony-free cationic photoinitiator and optionally (iv) a free radical photoinitiator and (v) optionally a toughening agent and its use in producing three-dimensional articles via rapid prototyping techniques.

BACKGROUND OF THE INVENTION

Liquid-based Solid Imaging, for example, Stereolithography, is a process whereby a photoformable liquid is applied as a thin layer to a surface and exposed to actinic radiation such that the liquid solidifies. Subsequently, new thin layers of photoformable liquids are coated onto previous layers of liquid or previously solidified sections. The new layers are then exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding liquid composition.

Photoformable resins currently used in generating the photohardened object generally contain a cationically polymerizable compound, such as an epoxy compound, and/or a radically polymerizable compound, such as an acrylate, together with cationic and/or radical photoinitiators. For example, JP 02075618A discloses a photocurable resin containing an epoxy, an acrylate, and an antimony-containing cationic photoinitiator and free radical photoinitiator.

Antimony is a toxic heavy metal and its presence in photohardened parts makes resins containing antimony less useful in many applications. In addition, because of their high reactivity, antimony hexafluoride salts are prone to instability and cause viscosity build-up in the resin over time. Removal of the cationically polymerizable compound so that the composition contains only radically polymerizable compounds is not an adequate solution since these resins produce objects having a much greater distortion due to acrylate shrinkage as well as insufficient green strength and brittleness. Adding stabilizers to the resin composition is also not an adequate solution since the stabilizers are consumed over time and must be continuously added to the resin in order to maintain a low viscosity.

Therefore, it would be desirable to produce a low viscosity, stable, antimony-free photocurable composition which can be cured rapidly in a liquid-based solid imaging process to produce an article having a high green strength, toughness, dimensional accuracy and minimal distortion.

Asahi Denka described the composition of hybrid epoxy acrylate formulations for laser imaging (JP 02075618A). This document teaches that cycloaliphatic epoxy resins combined with triaryl sulfonium antimony hexafluoride are the preferred epoxy-cationic initiator systems in optical molding systems. Commercial resins since this patent have used this same cationic initator as well as one or more other features of this patent. Subsequent patent disclosures have also focused on formulations using the antimony salt. The current disclosure shows surprisingly that certain formulations can now be developed which do not use the antimony hexafluoride salt.

Huntsman WO 03/089991 A2 describes SL resins containing reactive core shell particles, producing parts with smooth surfaces and good mechanical properties. In this patent, Huntsman uses triaryl sulfonium antimony hexafluoride salt as the cationic initiator. Reactive particles are stable and do not phase separate. In the current disclosure, formulations containing such reactive particles which, combined with a cationic photoinitiator that does not contain antimony hexafluoride, provide parts with improved and more balanced mechanical properties.

WO 03/093901 A1 describes the use of hydrogenated epoxy components in combinaison with oxetane components to give resins with "good water resistances".

The current invention uses non-antimony containing initiator salts and describes novel compositions with broad range of acrylic content. Preferably, it was found that formulations with greater than 25% acrylate content, using cationic initiator that do not contain antimony hexafluoride, yields surprisingly good overall properties.

US2005/0228064 A1 describes the use of tougheners.

U.S. Pat. No. 6,811,937 describe use of low MW polyTHF with specific acrylates to obtain high clarity. Dipentaerythritol hexaacrylate is used, whereas we demonstrated a similar improvement using dipentaerythritol pentaacrylate in our PF6 formulation. Preferably, in the compositions according to the invention, the free radically active component does not comprise dipentaerythritol hexaacrylate.

U.S. Pat. No. 6,379,866 describe the use of a reactive toughener made of a single reactive toughener.

WO 2005/045525 describe the use of nanoparticules.

SUMMARY OF THE INVENTION

The present invention provides a low viscosity photocurable composition containing about 35-80% by weight of a catonically curable component, about 5-60% by weight of a free radically active component, about 0.1-10% by weight of an antimony-free cationic photoinitiator, 0-10% by weight of a free radical photoinitiator, 0-40% by weight of a toughening agent and one or more optional components, where the percent by weight is based on the total weight of the photocurable composition.

The photocurable composition can be rapidly cured by forming a layer of the composition on a substrate or surface and exposing the layer imagewise to actinic radiation of sufficient intensity to cause substantial curing of the layer in the exposed areas so that an imaged cross-section is formed. A second layer of the photocurable composition may then be formed on the prior imaged cross-section and exposed to actinic radiation of sufficient intensity to cause substantial curing of the second layer and to cause adhesion to the prior imaged cross-section. This may be repeated a sufficient number of times for the purpose of building up a dimensionally accurate three-dimensional article which can be used in various applications.

DETAILED DESCRIPTION OF THE INVENTION

The present invention relates to photocurable compositions containing a cationically curable component, a free radically active component, an antimony-free cationic photoinitiator and optionally a free radical photoinitiator, toughening agent and one or more other optional components. It has been surprisingly found that when these components are combined, a low viscosity, non-toxic photocurable composition can be produced which, under rapid laser curing, can produce a three dimensional article having an excellent balance of green strength, toughness, flexibility, dimensional accuracy, durability, improved water resistance, improved color stability, improved transparency, improved cured and non-cured stability, room humidity resistance and strength with the term "three-dimensional article" referring to an article made from at least two layers of the cured resin composition. While not wishing to be bound by any particular theory, it is believed the antimony-free cationic photoinitiator generates active cationically curable components via different kinetics as compared to those generated by antimony photoinitiators. Upon curing, the active cationically curable components generated by the antimony-free photoinitiator also follow a different cure process resulting in less residual stress in the cured article to therefore produce an article exhibiting reduced brittleness and more toughness.

The invention permits to answer to several technical problems:

1/presence of heavy metals

The commercially available SL resins based on hybrid acrylate/epoxy chemistry use a cationic photoinitiator containing antimony salts. Cationic photoinitiators containing antimony salts are more reactive and have been used in SL formulations for many years. The presence of the toxic heavy metal makes them less useful for many applications. Phosphorous salts are less reactive, and substituted in current formulations do not allow the formation of solid parts of sufficient strength through the stereolithography process.

A solution is to use a sulfonium PF6 salt instead of the SbF6 salt. However, simply switching from the SbF6 salt to the PF6 salt in existing formulations does not work: green strength is extremely low and parts cannot be built through the stereolithography process. The formulation has to be modified in order to compensate for the lower speed of the PF6 salt. This disclosure describes surprising formulations that can provide high green strength while using a cationic photoinitiator containing no antimony salt. Additionally, it was found that the parts may have improved mechanical properties as compared to the currently available SL resins using antimony salt.

2/viscosity instability

The very reactive antimony hexafluoride salts are also responsible for viscosity instability in the bath of resin. From the very process of stereolithography, the resin is regularly subjected to low levels of UV-irradiations that triggers photodecomposition of the photoinitiator and produces small amounts of active species. The cationic photoinitiator containing antimony salt is especially known to be prone to unstability, due to its higher reactivity. Several attempts have been made to stabilise the formulations by adding various types of low basicity compounds. In its literature, Dow Chemicals, supplier of both salts, specifies that formulations containing PF6 salts are more stable in time than formulations containing SbF6 salts.

Several attempts have been made to answer the viscosity stability issues:

U.S. Pat. No. 5,665,792 (Du Pont de Nemours), describes the use of stabilisers having a limited solubilited in the formulation. They are present as a solid phase in the formulation in excess of their solubility limit. The concentration of the stabiliser is continuously replenished as the stabiliser reacts with undesired free acid.

U.S. Pat. No. 6,099,787 (Ciba Specialty chemicals) teaches the use of an organic viscosity stabiliser for filled SL resins.

U.S. Pat. No. 5,783,358 (Ciba Specialty chemicals) teaches the use of a basic ion exchanger brought into contact with the liquid radiation-curable composition, at least for a certain time. The ion exchanger is preferrably removed before commencement of the radiation curing.

WO 03/104296 (Vantico AG), teaches the use of a boronamine trichloride complex as a stabiliser of actinic radiation-curable compositions However, in these prior attempts, once the original amount of stabiliser has been consumed, viscosity starts to increase.

3/improved toughness and flexibility

SbF6 salts and PF6 salts generate the active species with different kinetics. The subsequent polymerisation of the epoxy species also follows a different cure process. It is the belief of the inventors that the different cure process induced by the PF6 salt results in less residual stress in the cured parts thus produces parts with reduced brittleness and better tougheness.

U.S. Pat. No. 5,476,748 (Ciba-Geigy Corporation) teaches the use of OH-terminated polyether, polyester, polyurethane to improve mechanical properties, especially elongation at break. I.e., addition of these polyols reduce brittleness U.S. Pat. No. 6,413,697 (Vantico AT&T US), teaches the use of cationically reactive modifiers and polyols to increase the flexibility and toughness of the cured articles.

U.S. Pat. No. 6,379,866 (from DSM) teaches the use of polyols and reactive tougheners to obtain flexible parts simulating the look and feel of polypropylene articles.

All 3 aspects (presence of heavy metals, viscosity instability and desired improvement of mechanical properties) may be improved in the formulations described in this disclosure. The formulations disclosed here contain:

A] 40 to 80% of a cationically component resin

B] 5-60% of one or more acrylate component of functionality 2, or more

C] 0-15% of one or more acrylate component of functionality >2. Preferred multifunctional acrylate will be a hyperbranched (dentric) polyester acrylate. (such as CN2301 from Sartomer)

D] 0-30% of the cationic component is an oxetane

E] optionally 0 to 40% of one or more toughening agent. This toughening agent can be a component containing one or more hydroxyl group or a reactive particule comprising a cross-linked polysiloxane core and a shell of reactive groups on the outer of the core, wherein the reactive group comprises epoxy groups, ethylenically unsaturated groups or hydroxyl groups.

F] 0.1-10% of a free-radical photoinitiator

G] 0.1-10% of a cationic photoinitiator that contains no antimony salts

Cationically Curable Component

As a first essential component, the photocurable composition of the present invention includes from about 35-80% by weight, based on the total weight of the photocurable composition, of a cationically curable component. The cationically curable component includes at least one cationically curable compound characterized by having functional groups capable of reacting via or as a result of a ring-opening mechanism initiated by cations to form a polymeric network. Examples of such functional groups include oxirane-(epoxide), oxetane-, tetrahydrofuran- and lactone-rings in the compound. Such compounds may have an aliphatic, aromatic, cycloaliphatic, araliphatic or heterocyclic structure and they may contain the ring groups as side groups, or the functional group can form part of an alicyclic or heterocyclic ring system. The cationically curable compound may be difunctional, trifunctional or may contain more than three cationically curable groups.

The cationically curable component may include a single liquid cationically curable compound, a combination of liquid cationically curable compounds, or a combination of one or more liquid cationically curable compounds and one or more solid cationically curable compounds which are soluble in the liquid.

In one embodiment, the cationically curable compound is an epoxy-containing compound. In general, any epoxy-containing compound is suitable for the present invention, such as the epoxy-containing compounds disclosed in U.S. Pat. No. 5,476,748 which is incorporated herein by reference. Examples of epoxy-containing compounds include polyglycidyl epoxy compounds, non-glycidyl epoxy compounds, epoxy cresol novolac and epoxy phenol novolac compounds.

The polyglycidyl epoxy compound may be a polyglycidyl ether, poly(β-methylglycidyl) ether, polyglycidyl ester or poly(β-methylglycidyl) ester. The synthesis and examples of polyglycidyl ethers, poly(β-methylglycidyl) ethers, polyglycidyl esters and poly(β-methylglycidyl) esters are disclosed in U.S. Pat. No. 5,972,563, which is incorporated herein by reference. For example, ethers may be obtained by reacting a compound having at least one free alcoholic hydroxyl group and/or phenolic hydroxyl group with a suitably substituted epichlorohydrin under alkaline conditions or in the presence of an acidic catalyst followed by alkali treatment. The alcohols may be, for example, acyclic alcohols, such as ethylene glycol, diethylene glycol and higher poly(oxyethylene) glycols, propane-1,2-diol, or poly(oxypropylene) glycols, propane-1,3-diol, butane-1,4-diol, poly(oxytetramethylene) glycols, pentane-1,5-diol, hexane-1,6-diol, hexane-2,4,6-triol, glycerol, 1,1,1-trimethylolpropane, bistrimethylolpropane, pentaerythritol and sorbitol. Suitable glycidyl ethers may also be obtained, however, from cycloaliphatic alcohols, such as 1,3- or 1,4-dihydroxycyclohexane, bis(4-hydroxycyclohexyl)methane, 2,2-bis(4-hydroxycyclohexyl)propane or 1,1-bis(hydroxymethyl)cyclohex-3-ene, or they may possess aromatic rings, such as N,N-bis(2-hydroxyethyl)aniline or p,p'-bis(2-hydroxyethylamino)diphenylmethane.

Particularly important representatives of polyglycidyl ethers or poly(β-methylglycidyl)ethers are based on monocyclic phenols, for example, on resorcinol or hydroquinone, on polycyclic phenols, for example, on bis(4-hydroxyphenyl) methane (Bisphenol F), 2,2-bis(4-hydroxyphenyl)propane (Bisphenol A), bis(4-hydroxyphenyl)S (Bisphenol S), alkoxylated Bisphenol A, F or S, triol extended Bisphenol A, F or S, brominated Bisphenol A, F or S, hydrogenated Bisphenol A, F or S, glycidyl ethers of phenols and phenols with pendant groups or chains, on condensation products, obtained under acidic conditions, of phenols or cresols with formaldehyde, such as phenol novolaks and cresol novolaks, or on siloxane diglycidyls.

Polyglycidyl esters and poly(P-methylglycidyl)esters may be produced by reacting epichlorohydrin or glycerol dichlorohydrin or β-methylepichlorohydrin with a polycarboxylic acid compound. The reaction is expediently carried out in the presence of bases. The polycarboxylic acid compounds may be, for example, glutaric acid, adipic acid, pimelic acid, suberic acid, azelaic acid, sebacic acid or dimerized or trimerized linoleic acid. Likewise, however, it is also possible to employ cycloaliphatic polycarboxylic acids, for example tetrahydrophthalic acid, 4-methyltetrahydrophthalic acid, hexahydrophthalic acid or 4-methylhexahydrophthalic acid. It is also possible to use aromatic polycarboxylic acids such as, for example, phthalic acid, isophthalic acid, trimellitic acid or pyromellitic acid, or else carboxyl-terminated adducts, for example of trimellitic acid and polyols, for example glycerol or 2,2-bis(4-hydroxycyclohexyl)propane, may be used.

In another embodiment, the epoxy-containing compound is a non-glycidyl epoxy compound. Non-glycidyl epoxy compounds may be linear, branched, or cyclic in structure. For example, there may be included one or more epoxide compounds in which the epoxide groups form part of an alicyclic or heterocyclic ring system. Others include an epoxy-containing compound with at least one epoxycyclohexyl group that is bonded directly or indirectly to a group containing at least one silicon atom. Examples are disclosed in U.S. Pat. No. 5,639,413, which is incorporated herein by reference. Still others include epoxides which contain one or more cyclohexene oxide groups and epoxides which contain one or more cyclopentene oxide groups.

Particularly suitable non-glycidyl epoxy compound's include the following difunctional non-glycidyl epoxide compounds in which the epoxide groups form part of an alicyclic or heterocyclic ring system: bis(2,3-epoxycyclopentyl)ether, 1,2-bis(2,3-epoxycyclopentyloxy)ethane, 3,4-epoxycyclohexyl-methyl 3,4-epoxycyclohexanecarboxylate, 3,4-epoxy-6-methyl-cyclohexylmethyl 3,4-epoxy-6-methylcyclohexanecarboxylate, di(3,4-epoxycyclohexylmethyl) hexanedioate, di(3,4-epoxy-6-methylcyclohexylmethyl) hexanedioate, ethylenebis(3,4-epoxycyclohexanecarboxylate), ethanediol di(3,4-epoxycyclohexylmethyl)ether, vinylcyclohexene dioxide, dicyclopentadiene diepoxide or 2-(3,4-epoxycyclohexyl-5,5-spiro-3,4-epoxy)cyclohexane-1,3-dioxane, and 2,2'-bis-(3,4-epoxy-cyclohexyl)-propane.

Highly preferred difunctional non-glycidyl epoxies include cycloaliphatic difunctional non-glycidyl epoxies, such as 3,4-epoxycyclohexyl-methyl 3',4'-epoxycyclohexanecarboxylate and 2,2'-bis-(3,4-epoxy-cyclohexyl)-propane, with the former being most preferred.

In another embodiment, the cationically curable compound is a poly(N-glycidyl) compound or poly(S-glycidyl) compound. Poly(N-glycidyl) compounds are obtainable, for example, by dehydrochlorination of the reaction products of epichlorohydrin with amines containing at least two amine hydrogen atoms. These amines may be, for example, n-butylamine, aniline, toluidine, m-xylylenediamine, bis(4-aminophenyl)methane or bis(4-methylaminophenyl)methane. Other examples of poly(N-glycidyl) compounds include N,N'-diglycidyl derivatives of cycloalkyleneureas, such as ethyleneurea or 1,3-propyleneurea, and N,N'-diglycidyl derivatives of hydantoins, such as of 5,5-dimethylhydantoin. Examples of poly(S-glycidyl) compounds are di-S-glycidyl derivatives derived from dithiols, for example ethane-1,2-dithiol or bis(4-mercaptomethylphenyl)ether.

It is also possible to employ epoxy-containing compounds in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

Other epoxide derivatives may be employed, such as vinyl cyclohexene dioxide, limonene dioxide, limonene monoxide, vinyl cyclohexene monoxide, 3,4-epoxycyclohexlmethyl acrylate, 3,4-epoxy-6-methyl cyclohexylmethyl 9,10-epoxystearate, and 1,2-bis(2,3-epoxy-2-methylpropoxy) ethane.

Also conceivable is the use of liquid pre-reacted adducts of epoxy-containing compounds, such as those mentioned above, with hardeners for epoxy resins. It is of course also possible to use liquid mixtures of liquid or solid epoxy resins in the novel compositions.

The following are examples of commercial epoxy-containing compounds suitable for use in the present invention: Uvacure® 1500 (3,4-epoxycyclohexylmethyl-3',-4'-epoxycyclohexanecarboxylate, available from UCB Chemicals Corp.); Epalloy® 5000 (epoxidized hydrogenated Bisphenol A, available from CVC Specialties Chemicals, Inc.) Heloxy™ 48 (trimethytol propane triglycidyl ether, available from Resolution Performance Products LLC); Heloxy™ 107 (diglycidyl ether of cyclohexanedimethanol, available from Resolution Performance Products LLC); Uvacure® 1501 and 1502 which are proprietary cycloaliphatic epoxides, Uvacure® 1530-1534 which are cycloaliphatic epoxides blended with a proprietary polyol, Uvacure® 1561 and Uvacure® 1562 which are proprietary cycloaliphatic epoxides having a (meth)acrylic unsaturation (all available from UCB Chemicals Corp.); Cyracure® UVR-6100, -6105, -6107, and -6110 which are all 3,4-epoxycyclohexylmethyl-3',4'-epoxycyclohexanecarboxylate, Cyracure® UVR-6128, a bis(3,4-epoxycyclohexyl)adipate (all available from Dow Chemical Co.); Araldite® CY 179, a 3,4-epoxycyclohexylmethyl-3',4'-epoxycyclohexanecarboxylate and Araldite® PY 284, a digycidyl hexahydrophthalate polymer (available from Huntsman Advanced Materials Americas Inc.); Celoxide™ 2021, a 3,4-epoxycyclohexyl methyl-3',4'-epoxycyclohexyl carboxylate, Celoxide™ 2021 P, a 3'-4'-epoxycyclohexanemethyl 3'-4'-epoxycyclohexylcarboxylate, Celoxide™ 2081, a 3'-4'-epoxycyclohexanemethyl 3'-4'-epoxycyclohexylcarboxylate modified caprolactone, Celoxide™ 2083, Celoxide™ 2085, Celoxide™ 2000, Celoxide™ 3000, Epolead GT-300, Epolead GT-302, Epolead GT-400, Epolead 401, Epolead 403 (all available from Daicel Chemical Industries Co., Ltd.) DCA, an alicyclic epoxy (available from Asahi Denka Co. Ltd); and E1, an epoxy hyperbranched polymer obtained by the polycondensation of 2,2-dimethylolpropionic acid functionalized with glycidyl groups (available from Perstorp AB).

In another embodiment, the cationically curable compound is an oxetane compound. The following compounds are given as examples of oxetane compounds having one oxetane ring in the compound which may be used in the present invention: 3-ethyl-3-hydroxymethyloxetane, 3-(meth)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobomyloxyethyl(3-ethyl-3-oxetanylmethyl)ether, isobornyl(3-ethyl-3-oxetanylmethyl) ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl (3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanyl methyl)ether, 2-hydroxypropyl(3-ethyl-3-oxetanylmethyl) ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl)ether, and the like. Other examples of oxetane compounds suitable for use include trimethylene oxide, 3,3-dimethyloxetane, 3,3-dichloromethyloxetane, 3,3-[1,4-phenylene-bis(methyleneoxymethylene)]-bis(3-ethyloxetane), 3-ethyl-3-hydroxymethyl-oxetane, and bis-[(1-ethyl(3-oxetanyl)methyl)]ether.

Examples of compounds having two or more oxetane rings in the compound which may be used in the present invention include: 3,7-bis(3-oxetanyl)-5-oxa-nonane, 3,3'-(1,3-(2-methyleny)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis [(3-ethyl-3-oxetanylmethoxy)methyl]propane, ethylene glycol bis(3-ethyl-3-oxetanylmethyl)ether, dicyclopentenyl bis (3-ethyl-3oxetanylmethyl)ether, triethylene glycol bis(3-ethyl-3oxetanylmethyl)ether, tetraethylene glycol bis(3-ethyl-3-oxetanylmethyl)ether, tricyclodecanediyldimethylene(3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified Bisphenol A bis(3-ethyl-3-oxetanylmethyl)ether, PO-modified Bisphenol A bis (3-ethyl-3-oxetanylmethyl)ether, EO-modified hydrogenated Bisphenol A bis(3-ethyl-3-oxetanylmethyl) ether, PO-modified hydrogenated Bisphenol A bis(3-ethyl-3-oxetanylmethyl)ether, EO-modified Bisphenol F (3-ethyl-3-oxetanylmethyl)ether, and the like.

Of the above compounds, it's preferable that the oxetane compounds have 1-10, preferably 1-4, and even more preferably 1 oxetane rings in the compound. Specifically, 3-ethyl-3-hydroxymethyl oxetane, (3-ethyl-3-oxetanylmethoxy)methylbenzene, 1,4-bis[(3-ethyl-3-oxetanylmethoxy)methyl] benzene, 1,2-bis(3-ethyl-3-oxetanylmethoxy)ethane and trimethylolpropane tris(3-ethyl-3-oxetanylmethyl)ether are preferably used. Commercially available oxetane compounds include Cyracure® UVR 6000 (available from Dow Chemical Co.) and Aron Oxetane OXT-101, OXT-121, OXT-211, OXT-212, OXT-221, OXT-610 and OX-SQ (available from Toagosei Co. Ltd.).

The cationically curable compound may also be a cyclic ether compound, cyclic lactone compound, cyclic acetal compound, cyclic thioether compound, spiro orthoester compound or vinylether compound.

Furthermore, as noted above, it is possible that the cationically curable component of the present invention includes a mixture of the cationically curable compounds described above. In one embodiment, the cationically curable component includes at least one hydrogenated bisphenol epoxy-containing compound having an average epoxy functionality of at least 2 and an epoxy equivalent weight (EEW) between 100 and 500. The hydrogenated bisphenol epoxy-containing compound may be present in the photocurable composition at a proportion of at least about 35% by weight, more preferably at least about 40% by weight, and even more preferably at least about 45% by weight based on the total weight of the photocurable composition. In yet another embodiment, the hydrogenated bisphenol epoxy-containing compound may be present at most about 80% by weight, preferably at most about 70% by weight, and even more preferably at most about 55% by weight based on the total weight of the photocurable composition. In yet a further embodiment, the hydrogenated bisphenol epoxy-containing compound may be present in the range of from about 35-80% by weight, preferably from about 40-60% by weight and even more preferably from about 45-55% by weight based on the total weight of the photocurable composition.

In another embodiment, the cationically curable component may further include one or more oxetane compounds so that the oxetane is present in the photocurable composition at an amount of at least about 5% by weight, more preferably at least about 15% by weight and even more preferably at least about 19% by weight based on the total weight of the photocurable composition. In yet another embodiment, the oxetane compound may be present at most about 40% by weight, more preferably at most about 30% by weight, and even more preferably at most about 25% by weight based on the total weight of the photocurable composition. In yet a further embodiment, the oxetane compound may be present in the range from about 0.01-40% by weight, more preferably 0.1-25% by weight, and even more preferably from about 0.5-15% by weight based on the total weight of the photocurable composition.

In yet another embodiment, the cationically curable component may further include one or more difunctional non-glycidyl epoxy compounds. The difunctional non-glycidyl epoxy compound may be present in the photocurable composition at an amount from about 0.01-20% by weight, more preferably from about 0.5-15% by weight and even more preferably from about 1-10% by weight based on the total weight of the photocurable composition.

The total amount of cationically curable component present in the photocurable composition may generally be at least about 35% by weight, more preferably at least about 45% by weight, and even more preferably at least about 55% by weight based on the total weight of the photocurable composition. In another embodiment, the total amount of the cationically curable component present is at most about 80% by weight, more preferably at most about 70% by weight, and even more preferably at most about 65% by weight based on the total weight of the photocurable composition. In yet another embodiment, the total amount of the cationically curable component present is in the range of from about 35-80% by weight, preferably from about 40-70% by weight, and even more preferably from about 45-65% by weight based on the total weight of the photocurable composition.

Free Radically Active Component

As a second essential component, the photocurable composition of the present invention includes at least about 5% by weight to about 60% by weight of a free radically active component based on the total weight of the photocurable composition. The free radically active component includes at least one free radically active compound that is activated in the presence of an initiator capable of initiating free radical polymerization such that it is available for reaction with other compounds bearing free radically active functional groups. Examples of free radically active compounds include compounds having one or more ethylenically unsaturated groups, such as, compounds having (meth)acrylate groups. "(Meth) acrylate" refers to an acrylate, a methacrylate, or a mixture thereof and includes monofunctional monomers containing one ethylenically unsaturated bond in one compound and polyfunctional monomers containing two or more unsaturated bonds in one compound.

In one embodiment, the (meth)acrylate is a monofunctional monomer. Examples of monofunctional monomers which may be used include: (meth)acrylamide, (meth)acryloylmorpholine, 7-amino-3,7-dimethyloctyl(meth)acrylate, isobutoxymethyl(meth)acrylamide, isobornyloxyethyl (meth)acrylate, isobornyl(meth)acrylate, 2-ethylhexyl(meth) acrylate, ethyldiethylene glycol(meth)acrylate, t-octyl(meth) acrylamide, diacetone(meth)acrylamide, dimethylaminoethyl(meth)acrylate, diethylaminoethyl (meth)acrylate, lauryl(meth)acrylate, dicyclopentadiene (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxyethyl(meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth) acrylate, 2-hydroxyethyl(meth)acrylate, 2-hydroxypropyl (meth)acrylate, vinylcaprolactam, N-vinylpyrrolidone, phenoxyethyl(meth)acrylate, butoxyethyl(meth)acrylate, pentachlorophenyl(meth)acrylate, pentabromophenyl(meth) acrylate, polyethylene glycol mono(meth)acrylate, polypropylene glycol mono(meth)acrylate, bornyl(meth)acrylate and methyltriethylene diglycol(meth)acrylate and mixtures thereof.

Examples of commercially available monofunctional monomers include SR 313A, 313B and 313D ($C_{12}$-$C_{14}$ alkyl (meth)acrylates available from Sartomer Co. Inc.) and Ciba® Ageflex FM6 (n-hexyl (meth)acrylate available from Ciba Specialty Chemicals).

In another embodiment, the (meth)acrylate is a polyfunctional or poly(meth)acrylate monomer having a functionality of 2 or more. Examples of poly(meth)acrylate monomers include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, tris(2-hydroxyethyl)isocyanurate di(meth) acrylate, tris(2-hydroxyethyl)isocyanurate tri(meth)acrylate, caprolactone-modified tris(2-hydroxyethyl)isocyanurate tri (meth)acrylate, trimethylolpropane tri(meth)acrylate, EO-modified trimethylolpropane tri(meth)acrylate, PO-modified trimethylolpropane tri(meth)acrylate, tripropylene glycol di(meth)acrylate, neopentyl glycol di(meth)acrylate, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol penta (meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate and mixtures thereof. The polyfunctional monomer is not dipentaerythritol hexaacrylate.

The following are examples of commercially available poly(meth)acrylates: SR 295 (pentaerythritol tetracrylate); SR 350 (trimethylolpropane trimethacrylate); SR 351 (trimethylolpropane triacrylate); SR 367 (tetramethylolmethane tetramethacrylate); SR 368 (tris(2-acryloxy ethyl) isocyanurate triacrylate); SR 399 (dipentaerythritol pentaacrylate); SR 444 (pentaerythritol triacrylate); SR 454 (ethoxylated (3) trimethylolpropane triacrylate); SR 833S (tricyclodecane dimethanol diacrylate) and SR 9041 (dipentaerythritol pentaacrylate ester) available from Sartomer Co Inc. In one embodiment, the poly(meth)acarylate comprises a difunctional acrylate compound, for example, SR 833S.

Additional examples of commercially available acrylates which may be used in the present invention include Kayarad®

R-526 (hexanedioic acid, bis[2,2-dimethyl-3-[(1-oxo-2-propenyl)oxy]propyl]ester), SR 238 (hexamethylenediol diacrylate), SR 247 (neopentyl glycol diacrylate), SR 06 (tripropylene glycol diacrylate), Kayarad® R-551 (Bisphenol A polyethylene glycol diether diacrylate), Kayarad® R-712 (2,2'-Methylenebis[p-phenylenepoly(oxy-ethylene)oxy]diethyl diacrylate), Kayarad® R-604 (2-Propenoic acid, [2-[1,1-dimethyl-2-[(1-oxo-2-propenyl)oxy]ethyl]-5-ethyl-1,3-dioxan-5-yl]-methyl ester), Kayarad® R-684 (dimethyloltricyclodecane diacrylate), Kayarad® PET-30 (pentaerythritol triacrylate), GPO-303 (polyethylene glycol dimethacrylate), Kayarad) THE-330 (ethoxylated trimethylolpropane triacrylate), DPHA-2H, DPHA-2C, Kayarad® D-310 (DPHA), Kayarad® D-330 (DPHA), DPCA-20, DPCA-30, DPCA-60, DPCA-120, DN-0075, DN-2475, Kayarad® T-1420 (ditrimethylolpropane tetraacrylate), Kayarad® T-2020 (ditrimethylolpropane tetraacrylate), TPA-2040, TPA-320, TPA-330, Kayarad® RP-1040 (pentaerythritol ethoxylate tetraacrylate) (available from Sartomer Co. Inc.); R-011, R-300, R-205 (methacrylic acid, zinc salt, same as SR 634) (available from Nippon Kayaku Co., Ltd.); Aronix M-210, M-220, M-233, M-240, M-215, M-305, M-309, M-310, M-315, M-325, M-400, M-6200, M-6400 (available from Toagosei Chemical Industry Co, Ltd.); Light acrylate BP-4EA, BP-4PA, BP-2PA, BP-2PA, DCP-A (available from Kyocisha Chemical Industry Co., Ltd.); New Frontier BPE-4, TEICA, BR-42M, GX-8345 (available from Daichi Kogyo Seiyaku Co., Ltd.); ASF-400 (available from Nippon Steel Chemical Co.); Ripoxy SP-1506, SP-1507, SP-1509, VR77, SP-4010, SP-4060 (available from Showa Highpoylmer Co., Ltd.); NK Ester A-BPE-4 (available from Shin-Nakamura Chemical Industry Co., Ltd.); SA-1002 (available from Mitsubishi Chemical Co., Ltd.); Viscoat-195, Viscoat-230, Viscoat-260, Viscoat-310, Viscoat-214HP, Viscoat-295, Viscoat-300, Viscoat-360, Viscoat-GPT, Viscoat-400, Viscoat-700, Viscoat-540, Viscoat-3000, Viscoat-3700 (available from Osaka Organic Chemical Industry Co., Ltd.).

The free radically active component can be or can comprise a copolymer obtainable by (co)polymerising a monomer comprising at least 1 (meth)acrylate group, preferably at least 2 (meth)acrylate groups (functionalities). Commerical examples are: fluorinated polyoxetane oligomer with acrylate functionality like Polyfox PF 3320, PF3305, from Omnova and polybutadiene di(meth)acrylate (CN307, CN303 from Sartomer).

The PolyFox family of fluorosurfactants is polymers with a molecular weight greater than 1,000. The PolyFox polymers are based on ether links—both the polymer backbone linkages and the link between the backbone and the perfluoroalkyl pendant side chains. The PolyFox flurosurfactants are synthesized from perfluoroalkyl starting materials with a fully fluorinated carbon chain length of $C_4$ or less. The current products are made with $C_2F_5$ or $CF_3$ perfluoroalkyl side chain structures. The fluorinated polyether is acrylate-terminated. The oxetane rings are opened.

The basic structure of PolyFox 3320 compound is the following (x+y equals about 20):

Structure 1

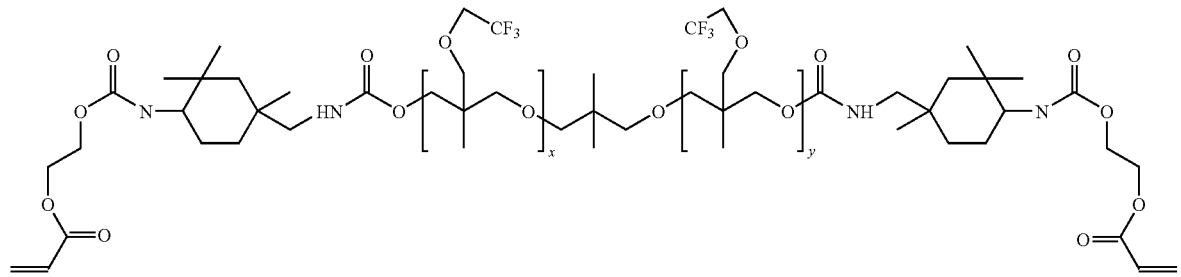

The free radically active compound may also be a (hyperbranched) dendritic polymer acrylate compound. Dendritic polymer acrylate compounds are compounds substantially built up from ester or polyester units, optionally in combination with ether or polyether units to yield a tree-like amorphous structure. These compounds, characterized by having a densely branched backbone and a large number of reactive end groups, are generally made from hydroxy-functional hyperbranched polymer polyols by any of a variety of methods suitable for making acrylate esters including transesterification, direct esterification or reaction with (meth)acryloyl halides.

An example of a dendritic polymer acrylate suitable for use is a dendritic polyester acrylate compound. The dendritic polyester acrylate compound preferably has an acrylate functionality of at least 12, and more preferably at least 14. Examples of commercially available dendritic polyester acrylates include CN 2301 and CN 2302 (available from Sartomer Co. Inc.). Also available are siloxane acrylates (Wacker Chemie AG).

The free radically active compound may also be an epoxy functionalized compound. Such epoxy functionalized compounds may be obtained by means well known, for example, by reacting a di- or poly-epoxide with one or more equivalents of an ethylenically unsaturated carboxylic acid. An example of such a compound is the reaction product of UVR-6105 with one equivalent of methacrylic acid. Commercially available compounds having epoxy and free-radically active functionalities include the "Cyclomer" series, such as Cyclomer M-100, M-101, A-200 and A-400 available from Daicel Chemical Industries Ltd., Japan, and Ebecryl-3605 and -3700 available from UCB Chemical Corp.

It is possible that the free radically active component of the present invention includes a mixture of the free radically active compounds described above. The free radically active component is not dipentaerythritol hexaacrylate.

In one embodiment, the free radically active component comprises at least one poly(meth)acrylate having a functionality of 2 and a molecular weight within the range from about 200-500. The photocurable composition may contain greater than 5% by weight, preferably greater than 15% by weight, and even more preferably greater than 25% by weight of the poly(meth)acrylate having a functionality of 2 based on the total weight of the photocurable composition. In another embodiment, the free radically active component comprises at most about 60% by weight, more preferably at most about 45% by weight, and even more preferably at most about 40% by weight of the poly(meth)acrylate having a functionality of 2 based on the total weight of the photocurable composition. In yet another embodiment, the poly(meth)acrylate having a functionality of 2 is present in the photocurable composition in the range of from about 5-60% by weight, more preferably from about 10-40% by weight, and even more preferably from about 15-25% by weight based on the total weight of the photocurable composition.

In another embodiment, the free radically active component may further include at least one hyperbranched (dendritic) polyester acrylate compound so that the dendritic polyester acrylate is present in the photocurable composition at an amount of at least 1% by weight, preferably at least about 5% by weight, and even more preferably at least about 10% by weight based on the total weight of the photocurable composition. In yet another embodiment, the dendritic polyester acrylate is present in an amount of at most about 40% by weight, preferably at most about 30% by weight, and even more preferably at most about 20% by weight based on the total weight of the photocurable composition. In yet another embodiment, the dendritic polyester acrylate is present in the range of from about 0.01-35% by weight, more preferably from about 0.5-25% by weight and even more preferably from about 1-15% by weight based on the total weight of the photocurable composition.

In yet another embodiment, the free radically active component may further comprise at least one epoxy functionalized compound. When present in the photocurable composition, the epoxy functionalized compound is preferably at an amount from about 0.01-30% by weight, preferably from about 0.5-25% by weight and even more preferably from about 1-20% by weight based on the total weight of the photocurable composition.

The total amount of the free radically active component present in the photocurable composition may generally be at least about 5% by weight, more preferably at least about 10% by weight, and even more preferably at least about 15% by weight based on the total weight of the photocurable composition. In another embodiment, the free radically active component may be present in an amount of at most about 60% by weight, more preferably at most about 50% by weight, and even more preferably at most about 40% by weight based on the total weight of the photocurable composition. In yet another embodiment, the free radically active component may be present in the range of from about 5-60% by weight, preferably from about 15-60%, more preferably greater than 25% by weight to less than about 40% by weight, and even more preferably from about 30-40% by weight based on the total weight of the photocurable composition.

Antimony-Free Cationic Photoinitiator

As a third essential component, the photocurable composition of the present invention includes from about 0.1-10% by weight, based on the total weight of the photocurable composition, of at least one antimony-free cationic photoinitiator. It has been surprisingly found that the use of an antimony-free cationic photoinitiator in the photocurable composition of the present invention produces a non-toxic photocurable composition having a cure speed similar to photocurable compositions containing an antimony cationic photoinitiator and that upon curing, produces an article having much improved mechanical properties.

The antimony-free cationic photoinitiator may be chosen from those commonly used to initiate cationic photopolymerization. Examples include onium salts with anions of weak nucleophilicity, e.g., halonium salts, iodosyl salts, sulfonium salts, sulfoxonium salts, diazonium salts, pyrylium salts or pyridinium salts. Metallocene salts are also suitable as photoinitiators. Onium salt and metallocene salt photoinitiators are described in U.S. Pat. No. 3,708,296; J. V. Crivello, "Photoinitiated Cationic Polymerization," UV Curing: Science & Technology, (S. P. Pappas, ed., Technology Marketing Corp. 1978) and J. V. Crivello and K. Dietliker, "Photoinitiators for Cationic Polymerisation," Chemistry and Technology of UV & EV Formulation for Coatings, Inks & Paints 327-478 (P. K. Oldring, ed., SITA Technology Ltd 1991), each of which are incorporated herein by reference.

The antimony-free cationic photoinitiator may also be a dialkylphenylacylsulfonium salt as described in U.S. Pat. No. 6,863,701 and which is incorporated herein by reference. These antimony-free cationic photoinitiators have the general formula $A_1(CA_2A_3OH)_n$ where $A_1$ is selected from phenyl, polycyclic aryl, and polycyclic heteroaryl, each optionally substituted with one or more electron donating groups, $A_2$ and $A_3$ are independently selected from hydrogen, alkyl, aryl, alkylaryl, substituted alkyl, substituted aryl and substituted alkylaryl and n is an integer from 1 to 10.

Preferred antimony-free cationic photoinitiators are compounds of the formula (I):

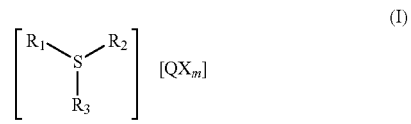

where $R_1$, $R_2$ and $R_3$ are each independently of one another $C_{6-18}$ aryl that is unsubstituted or substituted by suitable radicals, Q is boron or phosphorus, X is a halogen atom, and m is an integer corresponding to the valence of Q plus 1.

Examples of $C_{6-18}$ aryl are phenyl, naphtyl, anthryl, and phenanthryl. Suitable radicals include alkyl, preferably $C_{1-6}$ alkyl, such as methyl, ethyl, n-propyl, isopropyl, n-butyl, sec-butyl, iso-butyl, tert-butyl, or the various pentyl or hexyl isomers, alkoxy, preferably $C_{1-6}$ alkoxy such as methoxy, ethoxy, propoxy, butoxy, pentyloxy, or hexyloxy, alkylthio, preferably $C_{1-6}$ alkylthio, such as methylthio, ethylthio, propylthio, butylthio, pentylthio, or hexylthio, halogen, such as fluorine, chlorine, bromine, or iodine, amino groups, cyano groups, nitro groups, or arylthio, such as phenylthio. Preferred $QX_m$ groups include $BF_4$ and $PF_6$. A further example of a $QX_m$ group suitable for use is a perfluorophenylborate, for example, tetrakis(perfluorophenyl)borate.

Examples of commercially available antimony-free cationic photoinitiators include: (1) hexafluorophosphate ($PF_6$) salts including (i) Cyracure® UVI-6992 (Dow Chemical Co.), CPI 6992 (Aceto Corp.), Esacure® 1064 (Lamberti s.p.a.) and Omnicat 432 (IGM Resins B.V.) which are triarylsulfonium hexafluorophosphate salts (a mixture of thio and bis salts); (ii) SP-55 (Asahi Denka Co. Ltd.), Degacure KI 85 (Degussa Corp.) and SarCat KI-85 (available from Sartomer Co. Inc.) which are triarylsulfonium hexafluorophosphate salts (bis salts); (iii) SP-150 (Asahi Denka Co. Ltd.) a Bis [4-(di(4-(2-hydroxyethyl)phenyl)sulphonio)-phenyl]sulphide bis-hexafluorophosphate; (iv) Esacure® 1187 (Lamberti s.p.a.) a modified sulfonium hexafluorophosphate salt; (v) metallocene salts including cumenyl cyclopentadienyl iron (II) hexafluorophosphate, Irgacure® 261 (Ciba Specialty Chemicals), Naphthalenylcyclopentadienyl iron (II) hexafluorophosphate, benzyl cyclopentadienyl iron (II) hexafluorophosphate, cyclopentadienyl carbazole iron (II) hexafluorophosphate; (vi) iodonium salts including UV1242 a bis(dodecylphenyl) iodonium hexafluorophosphate (Deuteron), UV2257 a bis (4-methylphenyl) iodonium hexafluorophosphate (Deuteron), and Omnicat 440 (IGM Resins B.V.), Irgacure® 250 (Ciba Specialty Chemicals) a (4-methylphenyl)(4-(2-methylpropyl)phenyl)iodonium hexafluorophosphate; (vii) thioxantene salts including Omnicat 550 (IGM Resins B.V.) a 10-biphenyl-4-yl-2-isopropyl-9-oxo-9H-thioxanthene-10ium hexafluorophosphate, Omnicat 650 (IGM Resins B.V.) an adduct of 10-biphenyl-4-yl-2-isopropyl-9-oxo-9H-thioxanthene-10ium hexafluorophosphate with a polyol; and (2) Pentafluorophenyl borate salts including Rhodorsil 2074 (Rhodia) a (totylcumyl)iodonium tetrakis (pentafluorophenyl)borate. The antimony-free cationic photoinitiator may contain one antimony-free cationic photoinitiator or a mixture of two or more antimony-free cationic photoinitiators.

The proportion of the antimony-free cationic photoinitiator in the photocurable composition may be at least about 0.1% by weight, preferably at least about 1% by weight, and even more preferably at least about 4% by weight based on the total weight of the photocurable composition. In another embodiment, the antimony-free cationic photoinitiator is present at most about 10% by weight, more preferably at most about 8% by weight, and even more preferably at most about 7% by weight based on the total weight of the photocurable composition. In yet another embodiment, the antimony-free cationic photoinitiator is present in the range of from about 0.1-10% by weight, preferably from about 0.5-8% by weight, and more preferably from about 2-7% by weight based on the total weight of the photocurable composition.

Free Radical Photoinitiator

The photocurable composition of the present invention may also include from 0-10% by weight, preferably from about 0.01-10% by weight based on the total weight of the photocurable composition, of at least one free radical photoinitiator. The free radical photoinitiator may be chosen from those commonly used to initiate radical photopolymerization. Examples of free radical photoinitiators include benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, and 1,1-dichloroacetophenone; benzyl ketals, e.g., benzyl dimethylketal and benzyl diethyl ketal; anthraquinones, e.g., 2-methylanthraquinone, 2-ethylanthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Luzirin TPO); bisacylphosphine oxides; benzophenones, e.g., benzophenone and 4,4'-bis(N,N'-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl)ketone (Irgacure® 2959); I-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone. Polymeric free radical photoinitiators may also be used, such as Genopol BP-1 from Rahn.

Preferably, the free radical photoinitiator is a cyclohexyl phenyl ketone. More preferably, the cyclohexyl phenyl ketone is a 1-hydroxy phenyl ketone. Most preferably the 1-hydroxy phenyl ketone is 1-hydroxycyclohexyl phenyl ketone, e.g., Irgacure® 184. The free radical photoinitiator may comprise one free radical photoinitiator or two or more free radical photoinitiators.

The proportion of the free radical photoinitiator in the photocurable composition of the present invention may be from about 0.01-10% by weight, more preferably from about 0.2-8% by weight, and even more preferably from about 0.5-4% by weight based on the total weight of the photocurable composition. In another embodiment, the free radical photoinitiator is present at an amount of about 1:8, preferably about 2:5 parts by weight of free radical photoinitiator to antimony-free cationic photoinitiator.

More preferably, the combination of triarylsulfinium PF6 and Irgacure 184 allows best sensitivity and polymerization kinetics in the cationic/radical systems according to this invention.

Toughening Agents

The photocurable composition of the present invention may also include 0-40% by weight, preferably about 0.01-40% by weight, based on the total weight of the photocurable composition, of one or more toughening agents.

The toughening agent may be a reactive and/or non-reactive core shell type. For example, in one embodiment, the toughening agent which may be added to the photocurable composition includes reactive particles having a crosslinked elastomeric core and a shell containing reactive groups. The reactive particles may be made by the method disclosed in U.S. Pat. No. 4,853,434, which is incorporated herein by reference. This reference discloses reactive particles that are useful in producing fiber-reinforced plastics, structural adhesives, laminated plastics, and annealing lacquers.

The core of the reactive particles may be composed of polysiloxane, polybutadiene, polybutadiene-co-styrene, amine-terminated polybutadiene, methacrylated polybutadiene, alkyl acrylates, polyorganosiloxane, rubber, poly(ethylene glycol) modified urethane acrylate, polyurethane acrylate polycarbonate, PTFE or other elastomeric material. In one embodiment, the crosslinked core is composed of polysiloxane. In another embodiment, the polysiloxane core is a crosslinked polyorganosiloxane rubber that may include dialkylsiloxane repeating units, where alkyl is a $C_{1-6}$ alkyl. In yet another embodiment, the polysiloxane core includes dimethylsiloxane repeating units.

The shell containing the reactive groups may be composed of poly(styrene-co-acrylonitrile), poly(acrylonitrile), poly (carboxy-functionalized PMMA-co-styrene), polystyrene-co-butyl acrylate, polystyrene, poly(methylmethacrylate-co-maleic anhydride), poly(alkyl methacrylate), poly(styrene-co-acrylonitrile), polystyrene, poly(methylmethacrylate-co-styrene), poly(styrene-co-acrylonitrile), modified vinyl esters, epoxies, PMMA, polyglycidylmethacrylate-co-acrylonitrile, poly(cyclohexanedimethanol terephthalate), thermoplastic resin such as polycarbonate, poly(methylmethacrylate-co-glydicyl methacrylate), poly (methylmethacrylate-co-acrylonitrile-co-divinyl benzene).

The reactive groups of the shell may be epoxy groups, oxetane groups, ethylenically unsaturated groups, and/or hydroxy groups. In one embodiment, the reactive groups may be an oxirane, glycidyl, vinyl ester, vinyl ether, acrylate group, and mixtures thereof.

The reactive particles preferably have an average particle diameter of about 0.01-50 μm, more preferably about 0.1-5 μm, and even more preferably about 0.1 to about 3 μm. Examples of reactive particles that are commercially available include Albidur EP 2240, silicone-epoxy particles in Bisphenol A epoxy resin; Albidur VE 3320, silicone-vinyl ester particles in Bisphenol vinyl ester; and Albidur EP 5340, silicone-epoxy particles in cycloaliphatic epoxy resin (all available from Hanse Chemie).

In one embodiment, the reactive particles are added to the photocurable composition as a mixture of the reactive particles and a reactive liquid medium containing, e.g., epoxy or ethylenically unsaturated groups. For example, the reactive organosiloxane particles are dispersed in bisphenol A glycidyl ether for Albidur EP 2240, in bisphenol A vinyl ester for Albidur VE 3320 and in cycloaliphatic epoxide for Albidur EP 5340.

The amount of the reactive particles added to the photocurable composition may be varied depending on the cationically curable component and free radically active component. When present, the photocurable composition may contain at least about 0.5% by weight, more preferably at least about 1% by weight, and even more preferably at least about 1.5% by weight based on the total weight of the photocurable composition. In another embodiment, the reactive particles present is at most about 40% by weight more preferably at most about 15% by weight, and even more preferably at most about 10% by weight based on the total weight of the photocurable composition. In yet another embodiment, the reactive particles are present in a range of from about 0.01-40% by weight, preferably from about 0.5-15% by weight, and even more preferably from about 1-5% by weight of the reactive particles based on the total weight of the photocurable composition.

Other toughening agents which may be added to the photocurable composition in addition to or in lieu of the reactive particles include one or more hydroxyl-containing compounds. The hydroxyl-containing compound(s) have a functionality of at least 1 and more preferably at least 2, and are free of any groups which inhibit the curing reaction. The hydroxyl-containing compound may be an aliphatic or aromatic hydroxyl-containing compound. Examples include polyether polyols, polyester polyols, hydroxyl and hydroxyl/epoxy functionalized polybutadiene, 1,4-cyclohexanedimethanol, polycaprolactone diols and triols, ethylene/butylene polyols, and monohydroxyl functional monomers.

In one embodiment, the hydroxyl-containing compound is a polytetramethylene ether glycol ("poly THF"). The poly THF preferably has a molecular weight from about 250 to about 2500 and may be terminated with hydroxy, epoxy, or ethylenically unsaturated group(s). Commercially available poly THF's include Polymeg® poly THF's, for example, Polymeg® 1000, which is a linear diol with a nominal molecular weight of 1000 (Penn Specialty Chemicals). In another embodiment, the hydroxyl-functional compound is a caprolactone based oligo- or polyester, for example, a trimethylolpropane-triester with caprolactone, such as Tone® 301 (Dow Chemical Co.). In another embodiment, the hydroxy-functional compound is a polyester, for example k-flex 188 (from Kings Industries)

When present, the total amount of the hydroxyl-containing compound which may be added to the photocurable composition may generally be from about 0.01-40% by weight and preferably from about 0.5-20% by weight based on the total weight of the photocurable composition.

Other Optical Components

The photocurable composition of the present invention may also include other components, for example, stabilizers, modifiers, antifoaming agents, leveling agents, thickening agents, flame retardants, antioxidants, pigments, dyes, fillers, nano-fillers having a mean average particle size of 3 to 500 nanometers, and combinations thereof.

Stabilizers which may be added to the photocurable composition to prevent viscosity build-up during usage include butylated hydroxytoluene ("BHT"), 2,6-di-tert-butyl-4-hydroxytoluene, hindered amines, e.g., benzyl dimethyl amine ("BDMA"), N,N-Dimethylbenzylamine, and boron complexes. If used, the stabilizers may constitute from about 0.001% to about 5% by weight based on the total weight of the photocurable composition.

Fillers, including inorganic or organic, powdered, flaky or fibrous materials, may also be added. Examples of inorganic fillers include mica, glass or silica, calcium carbonate, barium sulfate, talc, glass or silica bubbles, zirconium silicate, iron oxides, glass fiber, asbestos, diatomaceous earth, dolomite, powdered metals, titanium oxides, pulp powder, kaoline, modified kaolin, hydrated kaolin metallic fillers, ceramics and composites. Examples of organic fillers include polymeric compounds, thermoplastics, core-shell, aramid, kevlar, nylon, crosslinked polystyrene, crosslinked poly(methyl methacrylate), polystyrene or polypropylene, crosslinked polyethylene powder, crosslinked phenolic resin powder, crosslinked urea resin powder, crosslinked melamine resin powder, crosslinked polyester resin powder and crosslinked epoxy resin powder. Both the inorganic and organic fillers can optionally be surface treated with various compound-coupling agents. Examples include methacryloxy propyl trimethoxy silane, beta-(3,4-epoxycyclohexyl)ethyl trimethoxy silane, gamma-glycidoxy propyl trimethoxy silane and methyl triethoxy silane. Mixtures of inorganic and organic fillers may also be used.

Further examples of preferred fillers are micro crystalline silica, crystalline silica, amorphous silica, alkali alumino silicate, feldspar, woolastonite, alumina, aluminum hydroxide, glass powder, alumina trihydrate, surface treated alumina trihydrate, and alumina silicate. Each of the preferred fillers is commercially available. The most preferred filler materials are inorganic fillers, such as mica, Imsil, Novasite, amorphous silica, feldspar, and alumina trihydrate. These fillers preferably are transparent to UV light, have a low tendency to refract or reflect incident light and provide good dimensional stability and heat resistance. Nano fillers, such as exfoliated clays (nano clays), nano mica, aluminum borate whiskers, nano barium sulphate (Nanofine, available from Solvay), silica nanoparticules dispersed in UV-curable monomers (Nanopox and Nanocryl range of materials from Nanoresins), alumina nanoparticules dispersed in UV-curable monomers (Nanobyk from Byk Chemie) may also be used.

The filler and nanofiller to be used for the resin composition for stereolithography according to the present invention must also satisfy the requirements that it doesn't hinder cationic or radical polymerizations and the filled SL composition must have a relatively low viscosity suitable for the stereolithography process. The fillers and nanofillers may be used alone or as a mixture of two or more fillers depending upon the desired performance. The fillers and nanofillers used in the present invention may be neutral, acidic or basic, with slightly basic being preferred. The filler particle size may vary depending on the application and the desired resin characteristics. It may vary between 50 nanometers and 50 micrometers. The nanofillers particle size may vary between 3 and 500 nanometers. Dispersants may be used to ensure good dispersion of these nanofillers.

If present, the content of fillers in the photocurable composition may generally be about 0.5% by weight to about 30% by weight based on the total weight of the photocurable composition. The photocurable compositions of the present invention can be prepared in a known manner, for example, by premixing individual components and then mixing these premixes, or by mixing all of the components together using customary devices, such as stirred vessels. In one embodiment, the mixing is carried out in the absence of light and, if desired, at slightly elevated temperatures ranging from about 30° C. to about 60° C. Furthermore, it is desirable for the photocurable composition to possess a viscosity at 25° C. in the range of 50-1000 cps, preferably 70-700 cps.

In one embodiment, the photocurable composition of the present invention is prepared by mixing from about 35-80% by weight of the cationically curable component from about 15-60% by weight of the free radically active component, from about 0.1-10% by weight of the antimony-free cationic photoinitiator, from 0-10% by weight of the free radical photoinitiator, and from 0-40% by weight of the toughening agent where the % by weight is based on the total weight of the photocurable composition. In another embodiment, the photocurable composition is produced by mixing from about 45-70% by weight of the cationically curable component comprising a hydrogenated bisphenol epoxy-containing compound and an oxetane compound, greater than 25% by weight to about 40% by weight of the free radically active component comprising at least one poly(meth)acrylate having a functionality of 2, from about 0.5-8% by weight of the antimony-free cationic photoinitiator, from about 0.5-4% by weight of the free radical photoinitiator, and from 0-40%, preferably from about 0.01-40% by weight of the toughening agent where the % by weight is based on the total weight of the photocurable composition.

The novel photocurable compositions can be polymerized by irradiation with actinic light, for example by means of electron beams, X-rays, UV or VIS light, preferably with radiation in the wavelength range of 280-650 nm. Particularly suitable are laser beams of HeCd, argon ion or nitrogen and also metal vapour and NdYAG lasers. This invention is extended throughout the various types of lasers existing or under development that are to be used for the solid imaging (stereolithography) process, e.g. solid state, argon ion lasers, etc, as well as to non-laser based irradiations. The person skilled in the art is aware that it is necessary, for each chosen light source, to select the appropriate photoinitiator and, if appropriate, to carry out sensitization. It has been recognized that the depth of penetration of the radiation into the composition to be polymerized, and also the operating rate, are directly proportional to the absorption coefficient and to the concentration of the photoinitiator. In stereolithography it is preferred to employ those photoinitiators which give rise to the highest number of forming free radicals or cationic particles and which enable the greatest depth of penetration of the radiation into the compositions which are to be polymerized.

It is preferred that the photocurable compositions of the present invention, upon polymerization by irradiation, produce an article having a green strength at 10 minutes of at least 100 MPa. It is also preferable that the photocurable compositions, after 1.5 hours of posteure in a posteure apparatus, produce a photohardened article having at least one of the following properties:
  (i) a flexural modulus in the range of between 1000-2300 MPa;
  (ii) an average elongation at break of at least 5%;
  (iii) a tensile strength of at least 30 MPa;
  (iv) the liquid photocomposition used to fabricate the article has a viscosity of less than 500 cps;
  (v) a notched izod impact of at least 0.5 ft. lbs/in; and/or
  (vi) an ash content of less than 0.05%.

Therefore, a further aspect of the present invention includes a process for producing an antimony-free three-dimensional article in sequential cross-sectional layers in accordance with a model of the article by forming a first layer of the photocurable composition; exposing the first layer to actinic radiation in a pattern corresponding to a respective cross-sectional layer of the model sufficient to harden the first layer in the imaged area; forming a second layer of the photocurable composition above the hardened first layer; exposing the second layer to actinic radiation in a pattern corresponding to a respective cross-sectional layer of the model sufficient to harden the second layer in the imaged area; and repeating the previous two steps to form successive layers as desired to form the antimony-free three-dimensional article which can be used in various applications, for example, the aerospace industry and the investment casting industry, or for medical applications.

In principle, any stereolithography machine may be used to carry out the inventive method. Stereolithography equipment is commercially available from various manufacturers. Table I lists examples of commercial stereolithography equipment available from 3D Systems Corp. (Valencia, Calif.).

TABLE 1

| MACHINE | WAVELENGTH (nm) |
| --- | --- |
| SLA ® 250 | 325 |
| SLA ® 500 | 351 |
| SLA ® 3500 | 355 |
| SLA ® 5000 | 355 |
| SLA ® 7000 | 355 |
| Viper si2 ™ | 355 |
| Viper Pro V | 355 |

Most preferably, the stereolithography process for producing a three-dimensional article from the photocurable composition of the present invention includes preparing the surface of the composition to form the first layer and then recoating the first layer and each successive layer of the three-dimensional article with a Zephyr™ recoater (3D Systems Corp., Valencia, Calif.), or an equivalent thereof.

It would be desirable to produce a low viscosity, stable, antimony-free photocurable composition which can be cured rapidly in a liquid-based solid imaging process to produce an article for use in medical applications having a high green strength, toughness, dimensional accuracy and minimal distortion.

The present invention relates to photocurable compositions containing a cationically curable component, a free radically active component, an antimony-free cationic photoinitiator and optionally a free radical photoinitiator, toughening agent and one or more other optional components. It has been surprisingly found that when these components are combined, a low viscosity non-toxic photocurable composition is produced which, under rapid laser curing, produces a three-dimensional medical article having an excellent balance of green strength, toughness, flexibility, dimensional accuracy, durability, improved water resistance, improved color stability, improved transparency, improved cured and non-cured stability, room humidity resistance and strength with the term "three-dimensional medical article" referring to a medical article made from at least two layers of the cured resin composition. While not wishing to be bound by any particular theory, it is believed the antimony-free cationic photoinitiator generates active cationically curable components via different kinetics as compared to those generated by antimony photoinitiators. Upon curing, the active cationically curable components produced by the antimony-free photoinitiator also follow a different cure process resulting in less residual stress in the cured article to produce an article exhibiting reduced brittleness and more toughness. Because the medical article is produced from a non-toxic photocurable composition free from any heavy metal-containing component, it may be used in medical applications. Thus, the medical article may be, for example, a medical device, a medical model and/or a medical implant, successfully meeting the requirements of USP 28, NF 23, for the biological tests of plastics, class VI, 70° C. equipment.

As used herein, a "medical device" refers to any physical item used in medical treatment and may include a catheter, a stent, a fluid administration system, a drug delivery system, a chemotherapy tip, a syringe, a cardiovascular device, a vascular access device, a surgical instrument, for example, an ergonomic surgical instrument, or a component part for medical equipment.

As used herein, a "medical model" refers to a three-dimensional article produced from two-dimensional data, such as, CAT scan and MRI data, which can be used for surgical planning, prosthesis design and as a teaching aid. Examples include models of an organ, such as a liver, heart, lung, kidney, bladder, brain, eye, intestines, pancreas and reproductive organ; a bone, such as a skull, jaw, spine, ribs, collarbone, shoulder blade, humerus, radius, ulna, teeth, finger and hand bones, breast bone, femur, tibia and fibula; a joint, such as ball and socket joints for the hip and shoulder and hinge joints such as the knee and elbow; teeth; and, tissue such as tumors, muscle and cartilage.

As used herein, a "medical implant" refers to a device that is fabricated for the purpose of embedding, or placing, within a body. Types of implants include implants suitable for the replacement, repair, support or modification of joints (such as those described above), bones (such as those described above), teeth, tissue (such as those described above) and the like.

The present invention also provides a process for producing a three-dimensional medical article comprising the steps of forming a first layer of the photocurable composition of the present invention on a surface; exposing the layer imagewise to actinic radiation to form an imaged cross-section, wherein the radiation is of sufficient intensity to cause substantial curing of the layer in the exposed areas; forming a second layer of the photocurable composition on the previously exposed imaged cross-section; exposing the second layer from the previous step imagewise to actinic radiation to form an additional imaged cross-section, wherein the radiation is of sufficient intensity to cause substantial curing of the second layer in the exposed areas and to cause adhesion to the previously exposed imaged cross-section; and repeating a sufficient number of times in order to build up the three-dimensional medical article.

Although the photocurable composition of the present invention is preferably used in a stereolithography process, it may also be used in three-dimensional jet printing or other rapid prototyping techniques to produce a three dimensional article.

In jet printing, successive droplets of the photocurable composition are applied (e.g. using an ink jet print head such as a piezoelectric jet printing head) at targeted locations on a substrate and irradiated by exposing the droplets to electromagnetic radiation to cure the composition and build up a three dimensional article of a desired shape. The droplets are deposited in accordance with the desired shape which is stored in a computer file, for example a CAD file. The substrate may include paper, textiles, tiles, printing plates, wallpaper, plastic, or paste. The photocurable composition may be irradiated pixel by pixel, line by line, layer by layer, and/or after several layers have been formed, and/or after all layers have been formed. The electromagnetic radiation employed may be UV light, microwave radiation, visible light laser beams, or other similar sources.

Alternatively, it is possible to deposit the photocurable composition of the present invention onto a powder. The powder may be spread as a thin layer onto the substrate and the photocurable composition jet deposited onto the powder at desired locations in a desired pattern. The pattern may then be cured by exposing the photocurable composition to UV light. A further layer of powder may then be placed on top of the first layer and the process repeated to build up the three dimensional article. Any uncured powder may be removed after the three dimensional article has been built. A final heat and/or radiation cure may be provided for the three dimensional article after the non-cured powder is removed. The photocurable composition is therefore fully integrated with the powder.

In another embodiment, the powder contains a reactive component that can react either with the photocurable composition or is facilitated by the photocurable composition to react with itself. The powder may contain organometallic polymers, oligomers, or monomers. Examples include polyacrylic acid, poly(acrylonitrile-co-butadiene, poly(allylamine), polyacrylic resins with functional acrylate groups, polybutadiene, epoxy functionalized butadienes, poly(glycidyl(meth)acrylate), poly THF, polycaprolactone diols, HEMA, HEA, maleic anhydride polymers such as styrene-maleic anhydride, polyvinylbutryals, polyvinyl alcohol, poly(4-vinylphenol), copolymers/blends of these compounds, and any of these compounds endcapped with epoxy, vinyl ether, acrylate/methacrylate, hydroxy, amine or vinyl moieties. The powder may further contain organic or inorganic fillers, a pigment, nanoparticles, a dye, and/or a surfactant.

In one embodiment, the three dimensional article produced from the photocurable composition of the present invention is used as a foundry pattern in investment casting. In investment casting, a disposable foundry pattern produced from the photocurable composition of the present invention is used to produce a mold in which parts can be cast. The mold is built up around the foundry pattern by a well known process the details of which differ depending upon the type of metal to be cast in the mold. In general, and using the casting of ferrous alloys to illustrate the investment casting process, the foundry pattern is coated with, i.e., invested in, a refractory slurry, for example an aqueous ceramic slurry, which is drained of excess water to form a coating, and the coating is then stuccoed with fine ceramic sand. This step is usually repeated several times (10 to 20 layers are not uncommon) after the first coating is dry. The invested foundry pattern is then placed in an open ended metal container which is filled with a coarse slurry of ceramic back-up material which hardens. The foundry pattern which is invested in the ceramic is then placed into a furnace or autoclave causing the foundry pattern to be melted or burned out of the resulting mold. Removal of the foundry pattern leaves a cavity in the mold corresponding in shape and dimension to the final part, although the foundry pattern (and therefore the cavity) can be slightly larger to compensate for shrinkage or machining of the part which is produced by the subsequent casting operation. Molten metal is introduced into the mold cavity and solidified by cooling. After solidification, the ceramic mold is broken away to release the finished part. While metal castings are primarily contemplated, any liquid material which solidifies may be cast in this manner, e.g., plastic or ceramic compositions.

Because the photocurable composition of the present invention is antimony-free, sensitive alloys can be cast in molds produced by the stereolithographically-made foundry pattern. Furthermore, complex foundry patterns can be accurately produced. Finally, it has been found that the foundry patterns have a low ash content (<0.05%), retain their accuracy and rigidity over time, making them ideal for casting reactive metals.

Other applications where the photocurable composition of the present invention may be used include: as an adhesive, as a coating, for example, a photoimageable coating, such as a photoresist, or a coating for optical fibers, as a sealant for light emitting diodes, or in paints, inks or varnishes or any other application, process or method where a shelf-stable photocurable composition having stable mechanical properties on curing is desired.

EXAMPLES A

The general procedure used for preparing three-dimensional articles with stereolithography equipment is as follows. The photocurable composition is placed in a vat designed for use with the stereolithography equipment at about 30° C. The surface of the composition, either in its entirety or in accordance with a predetermined pattern, is irradiated with a UV/VIS light source so that a layer of a desired thickness is cured and solidified in the irradiated area. A new layer of the photocurable composition is formed on the solidified layer. The new layer is likewise irradiated over the entire surface or in a predetermined pattern. The newly solidified layer adheres to the underlying solidified layer. The layer formation step and the irradiation step are repeated until a green model of multiple solidified layers is produced.

A "green model" is a three-dimensional article initially formed by the stereolithography process of layering and photocuring, where typically the layers are not completely cured. This permits successive layers to better adhere by bonding together when further cured. "Green strength" is a general term for mechanical performance properties of a green model, including modulus, strain, strength, hardness, and layer-to-layer adhesion. For example, green strength may be reported by measuring flexural modulus (ASTM D 790). An article having low green strength may deform under its own weight, or may sag or collapse during curing.

The green model is then washed in tripropylene glycol monomethyl ether ("TPM") and subsequently rinsed with water and dried with compressed air. The dried green model is next postcured with UV radiation in a postcure apparatus ("PCA") for about 60-90 minutes. "Postcuring" is the process of reacting the green model to further cure the partially cured layers. A green model may be postcured by exposure to heat actinic radiation, or both.

Tables A-II-VI list the components of each photocurable composition labeled as Examples A1-A23 and Comparative Example A1. The numbers in Tables A II-A VI refer to the weight percent of each component based on the total weight of the photocurable composition. Table A VII provides further identifying information for the trade names in Tables A II-A VI.

TABLE A II

| Component | Example A1 (% by weight) | Example A2 (% by weight) | Example A3 (% by weight) | Example A4 (% by weight) | Example A5 (% by weight) |
|---|---|---|---|---|---|
| Uvacure 1500 | 3.995 | 3.995 | 3.995 | 3.995 | 7.895 |
| Epalloy 5000 | 49 | 49 | 49 | 49 | 45 |
| UVR-6000 | | | | | |
| OXT-101 | 15 | 15 | 15 | 15 | |
| OXT-121 | | | | | 15 |
| CN 2301 | 5 | | | 15.1 | 5 |
| CN 2302 | 10.1 | 10.1 | 15.1 | | 10.1 |
| Ebecryl 3605 | 10 | 10 | | | 10 |
| SR 833S | | 5 | 10 | 10 | |
| Irgacure 184 | 2 | 2 | 2 | 2 | 2 |
| UVI 6992 | 5 | 5 | 5 | 5 | 5 |
| Stabilizer | 0.005 | 0.005 | 0.005 | 0.005 | 0.005 |
| Total % by Weight | 100.1 | 100.1 | 100.1 | 100.1 | 100 |

TABLE A III

| Component | Example A6 (% by weight) | Example A7 (% by weight) | Example A8 (% by weight) | Example A9 (% by weight) | Example A10 (% by weight) |
|---|---|---|---|---|---|
| Uvacure 1500 | 7.895 | 3.995 | 3.995 | 3.895 | |
| Epalloy 5000 | 45 | 49 | 49 | 49 | 52.895 |
| Limonene Dioxide | | 15 | | | |
| Limonene Monoxide | | | 15 | | |
| OXT-101 | | | | 15 | 15 |
| OXT-221 | 15 | | | | |
| CN 2301 | 5 | 5 | 5 | | 5 |
| CN 2302 | 10.1 | 10.1 | 10.1 | 10 | |
| Ebecryl 3605 | 10 | 10 | 10 | | |
| SR 833S | | | | 15.1 | 20.1 |
| Irgacure 184 | 2 | 2 | 2 | 2 | 2 |
| UVI 6992 | 5 | 5 | 5 | 5 | 5 |
| Stabilizer | 0.005 | 0.005 | 0.005 | 0.005 | 0.005 |
| Total % by Weight | 100 | 100.1 | 100.1 | 100 | 100 |

TABLE A IV

| Component | Example A11 (% by weight) | Example A12 (% by weight) | Example A13 (% by weight) | Example A14 (% by weight) | Example A15 (% by weight) |
|---|---|---|---|---|---|
| Uvacure 1500 | | 7.895 | 11 | | |
| Epalloy 5000 | 52.895 | 45 | 17 | | 30 |
| DCA | | | | 28 | |
| UVR-6000 | | | 15 | 15 | 24 |
| OXT-101 | 15 | 15 | | | |
| CN 2301 | | 5 | | | |
| CN 2302 | 6 | 10.1 | 20 | 26 | 26 |
| Ebecryl 3605 | | 10 | 30 | 24 | |
| Cyclomer A 400 | | | | | 13 |
| SR 833S | 19.1 | 5 | 10 | | |
| Irgacure 184 | 2 | 2 | 2 | 2 | 2 |
| UVI 6992 | 5 | 5 | 5 | 5 | 5 |
| Stabilizer | 0.005 | 0.005 | | | |
| Total % by Weight | 100 | 100 | 100 | 100 | 100 |

TABLE A V

| Component | Example A16 (% by weight) | Example A17 (% by weight) | Example A18 (% by weight) | Example A19 (% by weight) | Example A20 (% by weight) |
|---|---|---|---|---|---|
| Uvacure 1500 | | | | 8 | 3.895 |
| Epalloy 5000 | 28 | 32 | 40 | 28 | 49 |
| UVR-6000 | 15 | | 20 | 15 | 15 |
| CN 2301 | | | | | |
| CN 2302 | 26 | 26 | 15.1 | 15.1 | 15.1 |
| Ebecryl 3605 | 24 | | | 24.9 | |
| Ebecryl 3700 | | | | | |
| Cyclomer A 400 | | 20 | 10 | | 10 |
| SR 833S | | 5 | | | |
| Tone 301 | | 15 | | | |
| E1 | | | | 10 | |
| Irgacure 184 | 2 | 2 | 2 | 2 | 2 |
| UVI 6992 | 5 | 5 | 5 | 5 | 5 |
| Stabilizer | | | | | |
| Total % by Weight | 100 | 100 | 100.1 | 100 | 100 |

TABLE A VI

| Component | Example A21 (% by weight) | Example A22 (% by weight) | Example A23 (% by weight) | Comparative Example A1 (% by weight) |
|---|---|---|---|---|
| Uvacure 1500 | 3.895 | 7.895 | | 35 |
| Epalloy 5000 | 49 | 45 | 52.895 | |
| Heloxy 48 | | | | 16 |
| Heloxy 107 | | | | 13.2 |
| Heloxy 84 | | | | 8 |
| UVR-6000 | 15 | | | |
| OXT-101 | | 15 | 15 | |
| CN 2301 | | 5 | | |
| CN 2302 | 15.1 | 10.1 | | |
| Ebecryl 3605 | | 10 | 5 | |
| Ebecryl 3700 | | | | 6.3 |
| Cyclomer A 400 | 10 | | | |
| SR 399 | | | | 6 |
| SR 833S | | | 20.1 | |
| Dianol 320 | | | | 8 |
| Irgacure 184 | 2 | 2 | 2 | 2 |
| UVI 6992 | 5 | 5 | 5 | 5.5 |
| Stabilizer | 0.005 | 0.005 | 0.005 | 0.01 |
| Total % by Weight | 100 | 100 | 100 | 100 |

TABLE A VII

| Component | Source | Chemical Name |
|---|---|---|
| Uvacure 1500 | UCB Surface Specialties | 3,4-epoxycyclohexylmethyl 3',4'-epoxycyclohexanecarboxylate |
| Epalloy 5000 | CVC Specialty Chemicals Inc. | Epoxidized Hydrogenated Bisphenol A |
| UVR-6000 | Dow Chemical Co. | 3-ethyl-3-hydroxymethyl-1-oxetane |
| DCA | Asahi Denka Co. Ltd. | 3,4-epoxycyclohexylmethyl-3',4'-epoxycyclohexanecarboxylate |
| Cyclomer A400 | Daicel Chemical Industries, Ltd. | 3,4-epoxy-cyclohexylmethyl-acrylate |
| OXT-101 | Toagosei Co. Ltd. | 3-ethyl-3-hydroxymethyl-1-oxetane |
| OXT-121 | Toagosei Co. Ltd. | 1,4-Bis[3-ethyl-3-oxetanylmethoxy)methyl]benzene |
| OXT-221 | Toagosei Co. Ltd. | Bis[1-ethyl-3-oxetanylmethyl]ether |
| CN 2301 | Sartomer Co. Inc. | Hyperbranched polyester acrylate oligomer |
| CN 2302 | Sartomer Co. Inc. | Hyperbranched polyester acrylate oligomer |
| Ebecryl 3605 | UCB Surface Specialties | Partially acrylated bisphenol A epoxy |
| Ebecryl 3700 | UCB Surface Specialties | Bisphenol-A epoxy diacrylate |
| SR 833S | Sartomer Co. Inc. | Tricyclodecane dimethanol diacrylate |
| Cyclomer A 400 | Daicel Chemical Ind., Ltd. | 3,4-epoxy-cyclohexylmethyl acrylate |
| E1 | Perstorp Specialty Chemicals | Hyperbranched epoxy |
| Tone 301 | Dow Chemical Co. | Trifunctional polyol |
| Dianol 320 | Seppic | Propoxylated bisphenol A |
| Heloxy 48 | Resolution Performance Products | Triglycidyl ether |
| Heloxy 107 | Resolution Performance Products | Diglycidyl ether of cyclohexene dimethanol |
| Heloxy 84 | Resolution Performance Products | Polyglycidyl ether of an aliphatic triol |
| Irgacure 184 | Ciba Specialty Chemicals | 1-hydroxycyclohexyl phenyl ketone |

TABLE A VII-continued

| Component | Source | Chemical Name |
|---|---|---|
| UVI 6992 | Dow Chemical Co. | Mixed arylsulfonium hexafluorophosphate salts |

Examples A1-A23 and Comparative Example A1 were prepared by combining the components and mixing at room temperature until the mixture was a homogeneous photocurable composition. As shown below in Table A VIII, the photocurable compositions according to the present invention have a viscosity suitable for photofabrication:

TABLE A VIII

| Photocurable Composition | Viscosity at 25° C. (cps) |
|---|---|
| Example A1 | 555 |
| Example A2 | 465 |
| Example A3 | 285 |
| Example A4 | 410 |
| Example A5 | 700 |
| Example A7 | 565 |
| Example A9 | 260 |
| Example A10 | 325 |
| Example A11 | 280 |
| Example A12 | 460 |
| Example A20 | 182 |
| Example A21 | 200 |
| Example A22 | 460 |

Three dimensional articles were then prepared from the photocurable compositions on a stereolithography machine. Examples A1-A20 and Comparative Example A1 were prepared on an SLA350 machine while Examples A21-A23 were prepared on an SLA7000 machine. The articles, having a layer thickness of 0.1 mm, were built using a depth of penetration ranging from about 4.8-7.3 mil and a critical energy ranging from about 6.3-25.5 mJ/cm². All articles generated by photocurable compositions according to the present invention had a green strength ranging from about 137-1337 MPa at 10 minutes and 243-1900 MPa at 60 minutes. In comparison, the article produced by a commercially available resin according to Comparative Example A1 had a green strength of 25 MPa at 10 minutes which did not increase with time. However, when the resin according to Comparative Example A1 was prepared using an antimony-containing cationic photoinitiator in place of the antimony-free photoinitiator, the article produced had a green strength of 50 MPa at 10 minutes which further increased to 150 MPA after 60 minutes. Thus, replacing commercially available photocurable resins containing an antimony cationic photoinitiator with an antimony-free cationic photoinitiator will not produce a buildable resin due to low green strength. The green strengths of the articles are summarized in Table A IX below:

TABLE A IX

| Photocurable Composition | Green Strength at 10 Minutes (MPa) | Green Strength at 60 Minutes (MPa) |
|---|---|---|
| Example A1 | 137 | 243 |
| Example A2 | 182 | 330 |
| Example A3 | 776 | 938 |
| Example A4 | 1090 | 1309 |
| Example A5 | 140 | 220 |
| Example A9 | 286 | 361 |
| Example A10 | 1337 | 1604 |
| Example A11 | 458 | 565 |
| Example A12 | 137 | 243 |
| Example A13 | 330 | |
| Example A18 | 585 | |
| Example A19 | 1022 | 1198 |
| Example A20 | 353 | 737 |
| Example A21 | | 737 |
| Example A23 | 1190 | 1598 |
| Comparative Example A1 | 25 | 25 |
| Comparative Example A1 w/antimony-containing photoinitiator | 50 | 150 |

Mechanical properties of the articles were measured using a United Testing Systems Tensile Tester. Specifications for the United Tensile Testing Tester are as follows:

| | |
|---|---|
| Pre-Test Speed | 5 mm/min |
| Pre-Load | 0.05 kg |
| Test Speed | 5 mm/min |
| Maximum Load | 500 lbs |
| Extensiometer | 1 inch |

"Pre-Test Speed" is the rate at which the three-dimensional article is pulled taut before the testing begins.

"Pre-Load" is the amount of force that is applied to the three-dimensional article (at the Pre-Test Speed) before the testing begins.

"Test Speed" is the rate at which the three-dimensional article is pulled apart during the test process.

"Maximum Load" is the maximum amount of force that the United Testing Systems Tensile Tester can use when testing a specimen.

"Extensiometer" is a device that grips the three-dimensional article between two teeth having a distance between the teeth of one inch. A spring on the extensiometer measures the distance to which the three-dimensional article is stretched.

The results are shown below in Tables A X-A XIV:

TABLE A X

| Property (1.5 hours PCA oven) | Example A1 | Example A2 | Example A3 |
|---|---|---|---|
| Flexural Strength (psi) | 8604 | 7791 | 8097 |
| Flexural Modulus (ksi) | 315 | 278 | 279 |
| Tensile Strength (psi) | 5314 | 4810 | 5366 |
| Tensile Modulus (ksi) | 266 | 233 | 253 |
| Tensile Elongation at Break (%) | 22.7 | 19.2 | 19.0 |
| Average Notched Izod Impact Resistance (ft lbs/in) | 0.81 | 0.79 | 0.68 |

TABLE A XI

| Property (1.5 hours PCA oven) | Example A4 | Example A5 | Example A9 |
|---|---|---|---|
| Flexural Strength (psi) | 7442 | 8267 | 8842 |
| Flexural Modulus (ksi) | 249 | 261 | 286 |
| Tensile Strength (psi) | 5500 | 5189 | 6235 |
| Tensile Modulus (ksi) | 257 | 241 | 313 |
| Tensile Elongation at Break (%) | 16.1 | 8.7 | 7.6 |
| Average Notched Izod Impact Resistance (ft lbs/in) | 0.67 | 0.55 | 0.78 |

TABLE A XII

| Property (1.5 hours PCA oven) | Example A10 | Example A11 | Example A12 |
|---|---|---|---|
| Flexural Strength (psi) | 10000 | 9027 | |
| Flexural Modulus (ksi) | 347 | 315 | 285 |
| Tensile Strength (psi) | 6418 | 5990 | |
| Tensile Modulus (ksi) | 323 | 306 | 268 |
| Tensile Elongation at Break (%) | 10 | 10.9 | 20 |
| Average Notched Izod Impact Resistance (ft lbs/in) | 0.70 | 0.78 | 0.81 |

TABLE A XIII

| Property (1.5 hours PCA oven) | Example A13 | Example A16 | Example A17 |
|---|---|---|---|
| Flexural Modulus (ksi) | 241 | | |
| Tensile Strength (psi) | 6382 | 6236 | 4061 |
| Tensile Modulus (ksi) | 309 | 340 | 123 |
| Tensile Elongation at Break (%) | 3.5 | 3-6 | 14.1 |

TABLE A XIV

| Property (1.5 hours PCA oven) | Example A19 | Example A20 |
|---|---|---|
| Flexural Strength (psi) | | |
| Flexural Modulus (ksi) | 156 | 289 |
| Tensile Strength (psi) | 6418 | |
| Tensile Modulus (ksi) | 323 | |
| Tensile Elongation at Break (%) | 10 | 5.5 |
| Average Notched Izod Impact Resistance (ft lbs/in) | 0.70 | 0.60 |

The low viscosity photocurable composition of the present invention can produce cured products with minimal change in mechanical properties and deformation rate over time, high dimensional accuracy and green strength, and excellent mechanical strength, heat resistance, moisture resistance and water resistance. The cured product is therefore suitable for use as a three-dimensional article, such as for example, a trial product for mechanical parts.

Although making and using various embodiments of the present invention have been described in detail above, it should be appreciated that the present invention provides many applicable inventive concepts that can be embodied in a wide variety of specific contexts. The specific embodiments discussed herein are merely illustrative of specific ways to make and use the invention, and do not delimit the scope of the invention.

EXAMPLES B

Tables B II-B V list the components of each photocurable composition labeled as Examples B2, B3, B5-B26 and Comparative Examples B1 and B4. The numbers in Tables B II-B V refer to the weight percent of each component based on the total weight of the photocurable composition. Table B VI provides identifying information for the trade names of the components of Tables BII-BV.

TABLE B II

| Component | Comparative Ex. B1 (wt. %) | Ex. B2 (wt. %) | Ex. B3 (wt. %) | Comparative Ex. B4 (wt. %) | Ex. B5 (wt. %) |
|---|---|---|---|---|---|
| Uvacure 1500 | 56.96 | 56.96 | | | 48.9 |
| Epalloy 5000 | | | 48.9 | 48.9 | |
| OXT 101 | | | 15 | 15 | 15 |
| CN 2301 | | | 5 | 5 | 5 |
| SR 833S | | | 20.1 | 20.1 | 20.1 |
| CN120 | 18 | 18 | | | |
| Albidur EP2240 | 3 | 3 | 4 | 4 | 4 |
| Polymeg 1000 | 15 | 15 | | | |
| UVI 6976 | 4.95 | | | 5 | |
| UVI 6992 | | 4.95 | 5 | | 5 |
| Irgacure 184 | 2 | 2 | 2 | 2 | 2 |
| Stabilizers | 0.095 | 0.095 | | | |
| Total wt. % | 100 | 100 | 100 | 100 | 100 |

TABLE B III

| Component | Ex. B6 (wt. %) | Ex. B7 (wt. %) | Ex. B8 (wt. %) | Ex. B9 (wt. %) | Ex. B10 (wt. %) | Ex. B11 (wt. %) | Ex. B12 (wt. %) | Ex. B13 (wt. %) |
|---|---|---|---|---|---|---|---|---|
| Epalloy 5000 | 48.9 | 39.6 | 63.9 | 53.9 | 38.6 | 74 | 87 | 90 |
| OXT-101 | | | | 10 | 25 | | | |
| OXT-212 | 15 | 15 | | | | | | |
| CN 2301 | 5 | 5 | 5 | 5 | 5 | | | |
| SR 833S | 20.1 | 20.1 | 20.1 | 20.1 | 20.1 | 15 | 5 | |
| Albidur EP 2240 | 4 | 4 | 4 | 4 | 4 | 4 | | |
| Cyclohexane Dimethanol | | 9.3 | | | | | | |
| UVI 6992 | 5 | 5 | 5 | 5 | 5 | 5 | 6 | 10 |
| Irgacure 184 | 2 | 2 | 2 | 2 | 2 | 2 | 2 | |
| Epoxy wt. % | 52.9 | 43.6 | 67.9 | 57.9 | 42.6 | 78 | 87 | 90 |
| Oxetane wt. % | 15 | 15 | 0 | 10 | 25 | 0 | 0 | 0 |
| Acrylate wt. % | 25.1 | 25.1 | 25.1 | 25.1 | 25.1 | 15 | 5 | 0 |

TABLE B IV

| Component | Ex. B14 (wt. %) | Ex. B15 (wt. %) | Ex. B16 (wt. %) | Ex. B17 (wt. %) | Ex. B18 (wt. %) | Ex. B19 (wt. %) |
|---|---|---|---|---|---|---|
| Uvacure 5000 | 3.995 | 3.995 | 8.995 | 3.995 | 3.995 | 3.995 |
| Epalloy 5000 | 49 | 49 | 49 | 49 | 49 | 49 |
| OXT 101 | 15 | 25 | 15 | 15 | 15 | 15 |
| CN 2302 | 15 | 15 | | 10 | | |
| CN 2301 | | | 20 | | 15 | 15 |
| SR 833S | 10 | | | 5 | | 10 |
| Ebecryl 3605 | | | | 10 | 10 | |
| UVI 6992 | 5 | 5 | 5 | 5 | 5 | 5 |
| Irgacure 184 | 2 | 2 | 2 | 2 | 2 | 2 |
| Stabilizers | 0.005 | 0.005 | 0.005 | 0.005 | 0.005 | 0.005 |
| Epoxy wt. % | 52.995 | 52.995 | 57.995 | 53.995 | 52.995 | 52.995 |
| Oxetane wt. % | 15 | 25 | 15 | 15 | 15 | 15 |
| Acrylate wt. % | 25 | 15 | 20 | 24.04 | 24.04 | 25 |
| Dendritic Acrylate wt. % | 15 | 15 | 20 | 10 | 15 | 15 |

TABLE B V

| Component | Ex. B20 (wt. %) | Ex. B21 (wt. %) | Ex. B22 (wt. %) | Ex. B23 (wt. %) | Ex. B24 (wt. %) | Ex. B25 (wt. %) | Ex. B26 (wt. %) |
|---|---|---|---|---|---|---|---|
| Uvacure 5000 | 3.995 | | | | | | |
| Epalloy 5000 | 49 | 48.9 | 52.9 | 63 | 53 | 38 | 48 |
| OXT 101 | 15 | 15 | 15 | 15 | | 15 | 15 |
| CN 2302 | 15 | | | | | | |
| CN 2301 | | | | | | | 5 |
| SR 833S | | 25.1 | 25.1 | 15 | 40 | 40 | 21 |
| Albidur EP 2240 | | 4 | | | | | 4 |
| UVI 6992 | 5 | 5 | 5 | 5 | 5 | 5 | 5 |
| Irgacure 184 | 2 | 2 | 2 | 2 | 2 | 2 | 2 |
| Stabilizers | 0.005 | | | | | | |
| Epoxy wt. % | 53.995 | 52.9 | 52.9 | 63 | 53 | 38 | 52 |
| Oxetane wt. % | 15 | 15 | 15 | 15 | 0 | 15 | 15 |
| Acrylate wt. % | 15 | 25.1 | 25.1 | 15 | 40 | 40 | 26 |
| Dendritic Acrylate wt. % | 15 | 0 | 5 | 0 | 0 | 0 | 5 |

TABLE B VI

| Component | Source | Chemical Name |
|---|---|---|
| Uvacure 1500 | UCB Surface Specialties | 3,4-epoxycyclohexylmethyl 3',4'-epoxycyclohexanecarboxylate |
| Epalloy 5000 | CVC Specialty Chemicals Inc. | Epoxidized Hydrogenated Bisphenol A |
| Albidur EP 2240 | Hanse Chemie | Silicone-epoxy particles in Bisphenol A epoxy resin |
| OXT-101 | Toagosei Co. Ltd. | 3-ethyl-3-hydroxymethyl-1-oxetane |
| OXT-212 | Toagosel Co. Ltd. | 3-Ethyl-3-[2-ethylhexyloxy)methyl]oxetane |
| Polymeg 1000 | Penn Specialty Chemicals | Polytetramethylene ether glycol (M.W. 1000) |
| Cyclohexane Dimethanol | Sigma Aldrich | |
| CN 2301 | Sartomer Co. Inc. | Hyperbranched polyester acrylate oligomer |
| CN 2302 | Sartomer Co. Inc. | Hyperbranched polyester acrylate oligomer |
| Ebecryl 3605 | UCB Surface Specialties | Partially acrylated bisphenol A epoxy |
| SR 833S | Sartomer Co. Inc. | Tricyclodecane dimethanol diacrylate |
| CN 120 | Sartomer Co. Inc. | Bisphenol A based epoxy acrylate |
| Irgacure 184 | Ciba Specialty Chemicals | 1-hydroxycyclohexyl phenyl ketone |
| UVI 6992 | Dow Chemical Co. | Mixed arylsulfonium hexafluorophosphate salts |

The viscosity of several of the photocurable compositions was determined at 25° or 30° C. using a Brookfield viscometer and the results are presented in Table B VII:

TABLE B VII

| Photocurable Composition | Viscosity (cps) |
|---|---|
| Example B3 | 215 (at 30° C.) |
| Example B6 | 155 (at 30° C.) |
| Example B7 | 150 (at 30° C.) |
| Example B8 | 600 (at 30° C.) |
| Example B9 | 280 (at 30° C.) |
| Example B10 | 125 (at 30° C.) |
| Example B11 | 650 (at 30° C.) |
| Example B12 | 820 (at 30° C.) |
| Example B13 | 890 (at 30° C.) |
| Example B14 | 285 (at 25° C.) |
| Example B16 | 510 (at 25° C.) |
| Example B17 | 465 (at 25° C.) |
| Example B18 | 760 (at 325° C.) |
| Example B19 | 410 (at 25° C.) |
| Example B20 | 500 (at 25° C.) |
| Example B21 | 465 (at 25° C.) |
| Example B22 | 555 (at 25° C.) |
| Example B24 | 520 (at 25° C.) |
| Example B25 | 185 (at 25° C.) |
| Example B26 | 330 (at 25° C.) |

Test models were then produced from the photocurable compositions on either a 3D Systems SLA 350 or 7000 stereolithography machine or using silicon molds. When using silicon molds, the liquid resin is cast in the mold and solidified under actinic radiation for 1 hour. Comparative Examples B1 and 4B and Examples B2, B3, B5, B11 and B14-B26 were prepared on an SLA 350 machine while Examples B3 and B6-B13 were prepared on an SLA 7000 machine. The photosensitivity of Examples B3 and B6-B13 was determined on a SLA 7000 machine.

The photosensitivity was determined on "window panes" by measuring the layer thickness of single layer test specimens produced at different laser energies. The layer thickness was then plotted against the logarithm of the applied irradiation energy to produce a working curve. The slope of this curve was then determined to provide the depth of penetration ($D_p$, in mils). The energy value ($E_c$, in mJ/cm$^2$), or the point at which the working curve passes through the x-axis was also determined. The $E_c$ is the energy at which gelling of the material takes place as described in P. Jacobs, Rapid Prototyping and Manufacturing, Soc. Of Manufacturing Engineers, 1992, p. 270, which is incorporated herein by reference.

The green strength was determined by measuring the flexural modulus, at 1 mm deflexion, 10 minutes and 60 minutes after the models were produced. The glass transition temperature ($T_g$) was determined using dynamic mechanical analysis. Water resistance was determined be immersing the models in water at room temperature and determining the retained flexural modulus after 1 week.

Other physical properties of fully cured test models (post-cured in a PCA oven for 90 minutes) were determined according to the following standard ASTM and ISO procedures which are herein incorporated by reference:

|  | ASTM Standard | ISO Standard |
|---|---|---|
| Tensile Properties (elongation to break, strength, modulus) | D 638 | 527 |
| Flexural Properties (max. strength, modulus) | D 790 | 178 |
| Notched Izod Impact (impact strength) | D 256 | n/a |
| Bend Notched Impact (fracture toughness, stress intensity coefficient) | n/a | 13586 |

TABLE BVIII

| Property | Comparative Ex. B1 | Ex. B2 | Ex. B3 | Comparative Ex. B4 | Ex. B5 |
|---|---|---|---|---|---|
| Green Strength at 10 minutes (MPa) | 220 | 25 | 1113 | 1669 | 50 |
| Green Strength at 60 minutes (MPa) | 440 | 26 | 1553 | 1831 | 52 |
| $D_p$ (mils) |  |  | 5.14 | 5.48 | 5.44 |
| $E_c$ (mJ/cm$^2$) |  |  | 8.84 | 10.37 | 12.07 |
| Tensile Modulus (MPa) |  |  | 2188 | 2339 | 2242 |
| Elongation to Break (%) |  |  | 10 | 12 | 3.5 |
| Tensile Strength (MPa) |  |  | 45 | 46 | 30 |
| Flexural Modulus (MPa) |  |  | 2098 | 2063 | 2160 |
| Flexural Strength (MPa) |  |  | 67 | 66 | 50 |
| Notched Izod Impact (ft. lbs/in) |  |  | 0.95 | 0.54 | 0.52 |
| $T_g$ (° C.) |  |  | 55 | 69 | 70 |
| Water Resistance (%) |  |  | 76 | 80 | 80 |
| DSC Exotherm Peak (° C.) |  |  | 313 | 213 | 315 |

TABLE B IX

| Property | Ex. B3 | Ex. B6 | Ex. B7 | Ex. B8 | Ex. B9 | Ex. B10 | Ex. B11 | Ex. B12 | Ex. B13 |
|---|---|---|---|---|---|---|---|---|---|
| $D_p$ (mils) | 5.22 | 5.22 | 2.21 | 4.50 | 4.65 | 4.52 | 4.94 | 3.16 | 3.00 |
| $E_c$ (mJ/cm$^2$) | 18.64 | 28.1 | 19.03 | 14.56 | 16.14 | 15.94 | 9.09 | 57.46 | 68.88 |
| $E_4$ (mJ/cm$^2$) | 40.082 | 60.488 | 116.753 | 35.427 | 38.081 | 38.653 | 20.42 | 203.835 | 261.008 |
| $E_{11}$ (mJ/cm$^2$) | 153.074 | 231.390 | 2791.805 | 168.030 | 171.106 | 182.072 | 84.172 | 1868 | 2686.091 |
| Tensile Modulus (MPa) | 1515 | 452 | 136 | 1100 | 1430 | 2260 | 900 | 1250 | 1270 |
| Elongation to Break (%) | 2.91 | 8.1 | 30.6 | 2.6 | 2.8 | 2.8 | 1.3 | 2.5 | 3.1 |
| Tensile Strength (MPa) | 27.8 | 9.9 | 12.3 | 18.5 | 27.0 | 39.3 | 1.0 | 20.7 | 21.4 |
| Flexural Modulus (MPa) | 1522 | 300 | 77 | 632 | 1124 | 1580 | 730 | 1020 | 1240 |
| Flexural Strength (MPa) | 43.3 | 13.9 | 7.2 | 23.9 | 40.6 | 52.1 | 17.1 | 29.7 | 41.5 |

TABLE BX

| Property | Ex. B3 | Ex. B11 | Ex. B14 | Ex. B15 | Ex. B6 | Ex. B17 | Ex. B18 | Ex. B19 |
|---|---|---|---|---|---|---|---|---|
| Green Strength at 10 min. (MPa) | 1190 | 15 | 776 | * | * | 182 | 576 | 1090 |
| Green Strength at 60 min. (MPa) | 1598 | 26 | 938 | * | * | 330 | 691 | 1309 |
| $D_p$ (mils) | 5.55 | 5.55 | 7.28 | 8.27 | 4.69 | 4.86 | 6.08 | 6.50 |
| $E_c$ (mJ/cm$^2$) | 10.22 | 12.43 | 25.46 | 41.46 | 7.14 | 6.31 | 12.23 | 13.91 |
| $E_4$ (mJ/cm$^2$) | 21.01 | 25.56 | 44.10 | 67.25 | 16.75 | 14.37 | 23.61 | 25.74 |
| $E_{11}$ (mJ/cm$^2$) | 74.15 | 90.21 | 115.4 | 156.8 | 74.52 | 60.67 | 74.67 | 75.56 |
| Tensile Modulus (MPa) | 2188 | 740 | 1744 | | 620 | 1606 | 1503 | 1772 |
| Elongation to Break (%) | 10 | 8.1 | 19 | | 7.6 | 19.2 | 9.8 | 15.1 |
| Tensile Strength (MPa) | 45 | 15.6 | 37 | | 13 | 33 | 31 | 38 |
| Flexural Modulus (MPa) | 2098 | 634 | 1923 | | 800 | 1916 | 2234 | 1717 |
| Flexural Strength (MPa) | 67 | 19 | 56 | | 21 | 54 | 64 | 51 |
| Notched Izod Impact (ft. lbs/in) | 0.95 | | 0.68 | | 0.4 | 0.79 | 0.70 | 0.67 |

* Too soft to measure

TABLE B XI

| Property | Ex. B20 | Ex. B21 | Ex. B22 | ExB23 | Ex. B24 | Ex. B25 | Ex. B26 |
|---|---|---|---|---|---|---|---|
| Green Strength at 10 min. (MPa) | 423 | 1120 | 1343 | 734 | 443 | 1903 | 1104 |
| Green Strength at 60 min. (MPa) | 581 | 1322 | 1353 | 899 | 551 | 2150 | 1265 |
| $D_p$ (mils) | 7.51 | 5.09 | 5.65 | 5.79 | 7.49 | 5.66 | 5.71 |
| $E_c$ (mJ/cm$^2$) | 28.87 | 7.07 | 5.69 | 8.13 | 9.9 | 5.71 | 10.16 |
| $E_4$ (mJ/cm$^2$) | 49.18 | 15.51 | 11.55 | 16.22 | 16.89 | 11.58 | 20.47 |
| $E_{11}$ (mJ/cm$^2$) | 125 | 61.37 | 39.87 | 54.35 | 43 | 39.87 | 69.75 |
| Tensile Modulus (MPa) | 1344 | 1344 | | | 1590 | 2578 | 2220 |
| Elongation to Break (%) | 18.9 | 25.1 | | | 5.0 | 6.7 | 9.0 |
| Tensile Strength (MPa) | 22 | 28 | | | 34.2 | 53 | 45.1 |
| Flexural Modulus (MPa) | 1627 | 1669 | | | 1613 | 2260 | 2000 |
| Flexural Strength (MPa) | 47 | 45 | | | 49 | 75 | 62.7 |
| Notched Izod Impact (ft. lbs/in) | 1.06 | 0.78 | | | 0.41 | 0.39 | 0.61 |

Comparative Example B1 (which is similar to a commercially available photocurable composition) and Example B2 above demonstrate that simply substituting an antimony cationic photoinitiator with an antimony-free photoinitiator produces an article having insufficient green strength. Furthermore, Example B3 demonstrates the improved impact resistance that is achieved from cured articles produced from the photocurable composition of the present invention as compared to Comparative Example B4. Moreover, Examples B3 and B5 demonstrate that the photocurable compositions of the present invention are much more stable since the DSC exotherm peak (which indicates thermal stability of the mixture) for these compositions is much higher than DSC exotherm peak for the composition containing antimony (i.e. Comparative Example B4).

EXAMPLES C

Table CII lists the components of a photocurable composition according to the present invention and labeled as Example C1. The numbers in Table CII refer to the weight percent of each component based on the total weight of the photocurable composition. Table CIII provides identifying information for the trade names of the components of Table CII.

TABLE C II

| Component | Example C1 (wt. %) |
|---|---|
| Epalloy 5000 | 52.9 |
| OXT-101 | 15 |

TABLE C II-continued

| Component | Example C1 (wt. %) |
| --- | --- |
| CN 2301 | 5 |
| SR 833S | 20.1 |
| UVI 6992 | 5 |
| Irgacure 184 | 2 |

TABLE C III

| Component | Source | Chemical Name |
| --- | --- | --- |
| Epalloy 5000 | CVC Specialty Chemicals Inc. | Epoxidized Hydrogenated Bisphenol A |
| OXT-101 | Toagosei Co. Ltd. | 3-ethyl-3-hydroxymethyl-1-oxetane |
| CN 2301 | Sartomer Co. Inc. | Hyperbranched polyester acrylate oligomer |
| SR 833S | Sartomer Co. Inc. | Tricyclodecane dimethanol diacrylate |
| Irgacure 184 | Ciba Specialty Chemicals | 1-hydroxycyclohexyl phenyl ketone |
| UVI 6992 | Dow Chemical Co. | Mixed arylsulfonium hexafluorophosphate salts |

The viscosity of the photocurable composition and a commercially available acrylate-containing photocurable composition (hereinafter referred to as "Comparative Example C") were determined at 30° C. using a Brookfield viscometer. Test models were then produced from the photocurable compositions of Example C1 and Comparative Example C on an SLA 7000 stereolithography machine. The test models were conditioned for 3-5 days at 23° C. and 50% RH before mechanical testing.

The photosensitivity of the photocurable compositions was determined as explained in Examples B description.

Other physical properties of fully cured test were determined according to ISO standards explained in Examples B.

TABLE C IV

| Property | Example C1 | Comparative Example C |
| --- | --- | --- |
| Viscosity at 30° C. (cPs) | 205 | 1090 |
| $D_p$ (mils) | 6.10 | 6.3 |
| $E_c$ (mJ/cm$^2$) | 13.95 | 4.3 |
| Tensile Modulus (MPa) | 2000 | 1045 |
| Elongation to Break (%) | 4.2 | 6.0 |
| Tensile Strength (MPa) | 35.5 | 26.5 |
| Flexural Modulus (MPa) | 2080 | 1160 |
| Flexural Strength (MPa) | 75 | 52 |
| Bend Notched Impact, $G_{1C}$ (J/m$^2$) | 915 | 417 |
| Bend Notched Impact, $K_{1C}$ (MPa/m$^{1/2}$) | 1.55 | 0.75 |
| Heat Deflection Temperature at 0.45 Mpa (° C.) | 47.6 | 50.4 |
| Curl Distortion (mm) | 0.186 | 1.776 |

The results above demonstrate that the viscosity of Example C1 is much lower than Comparative Example C (which is similar to a commercially available acrylate-containing photocurable composition). Furthermore, the results demonstrate the improved impact resistance in the test model produced from the photocurable composition of Example C1 as compared to Comparative Example C. The Example C1 test model is therefore much less brittle than the test model of Comparative Example. Finally, the accuracy of the test model produced from the photocurable composition of Example C1 is much improved when compared to the test model produced from the photocurable composition of Comparative Example C as demonstrated by the ten-fold reduction in the curl distortion.

EXAMPLES D

The formulations indicated in the examples D are prepared by mixing the components, with a stirrer at room temperature, until a homogeneous composition is obtained. The physical data relating to the formulations are obtained as described below.

Test specimens have been manufactured using either SLA350 (examples D5 to D13) or SLA7000 (examples D1-D4, D32-D37) machines, both from 3D Systems, or cured in a mold at room temperature in a UV-oven for 1 h 30 min (examples D14-D31).

After fabrication in the SLA machines, specimens are cleaned using isopropanol, dried, and post-cured in a 3D-Systems Post-Curing Apparatus (PCA) for 1 h 30 min to allow full cure of the resin. Test specimens are conditioned for 3-5 days at 23° C., 50% RH before mechanical testing.

Mechanical testing of fully cured parts is being done according to ISO or ASTM standards. Examples D1-D4, D32-D37 have been tested according to ISO standards. Examples D5-D13 have been tested according to ASTM standards.

The viscosity of the liquid mixtures is determined at 25° C. or 30° C., using a Brookfield viscometer (mPa·s):

TABLE D I

| Examples | Viscosity at 30° C. | Examples | Viscosity at 25° C. |
| --- | --- | --- | --- |
| D1 | 60 | D5 | 280 |
| D2 | 150 | D6 | 285 |
| D3 | 80 | D7 | 230 |
| D4 | 160 | D8 | 270 |
| D14 | 145 | D9 | 270 |
| D15 | 130 | D10 | 200 |
| D16 | 145 | D11 | 250 |
| D17 | 100 | D12 | 245 |
| D18 | 100 | D13 | 310 |
| D19 | 210 | | |
| D20 | 130 | | |
| D21 | 110 | | |
| D22 | 90 | | |
| D23 | 70 | | |
| D24 | 170 | | |
| D25 | 160 | | |
| D26 | 155 | | |
| D27 | 150 | | |
| D28 | 170 | | |
| D29 | 155 | | |
| D30 | 155 | | |
| D31 | 165 | | |
| D32 | 350 | | |
| D33 | 570 | | |
| D34 | 120 | | |
| D35 | 230 | | |
| D36 | 70 | | |
| D37 | 145 | | |

Raw Materials Used in Examples D are Reported in Table DII

TABLE D II

| Trade Name | Source | Chemical Name |
| --- | --- | --- |
| Uvacure 1500 | Cytec | 3,4 epoxycyclohexylmethyl 3',4'epoxycyclohexanecarboxylate |
| Epalloy 5000 | CVC Chemicals | Hydrogenated bisphenol A diglycidyl ether |
| OXT-101 | Toagosei | 3-ethyl-3hydroxymethyl oxetane |
| Grilonite F-713 | EMS-Primid | Polytetrahydrofurane diglycidyl ether |
| polyBD 605E | Sartomer Co. | Hydroxyl-terminated epoxydised polybutadiene (MW ca. 1300) |

TABLE D II-continued

| Trade Name | Source | Chemical Name |
| --- | --- | --- |
| k-flex 188 | King Industries | Polyester polyol |
| Terathane 1000 | Invista | Polytetramethylene ether glycol (MW ca. 1000) |
| Terathane 250 | Invista | Polytetramethylene ether glycol (MW ca. 250) |
| Acclaim 12200 | Bayer | Polyether-based polyol (MW ca. 11200) |
| Diethylene glycol | Sigma-Aldrich | |
| CN2301 | Sartomer Co. | Hyperbranched polyester acrylate oligomer |
| CN2302 | Sartomer Co. | Hyperbranched polyester acrylate oligomer |
| SR833S | Sartomer Co. | Tricyclodecane Dimethanol diacrylate |
| CN 131 | Sartomer Co. | Aromatic monoacrylate |
| SR 306 | Sartomer Co. | Tripropylene glycol triacrylate |
| SR399 | Sartomer Co. | Dipentaerythrytol pentacrylate |
| SR495 | Sartomer Co. | Caprolactone acrylate |
| Nanopox A610 | Nano Resins | Silica nanoparticles modified Cycloaliphatic epoxy resin |
| Nanobyk-3601 | Byk Chemie | Alumina nanoparticles dispersed in tripropylene glycol diacrylate |
| Nanofine | Solvay | Baryum sulfate nanoparticules |
| UVI6976 | Dow Chemicals Company | Mixture of PhS—$(C_6H_4)$—$S^+Ph_2$ $SbF_6^-$ and $Ph_2S^+$—$(C_6H_4)S(C_6H_4)$—$S^+Ph_2$-$(SbF_6^-)_2$ |
| UVI6992 | Dow Chemicals Company | Mixture of PhS—$(C_6H_4)$—$S^+$-$Ph_2$ $PF_6^-$ and $Ph_2S^+$—$(C_6H_4)$—$S$—$(C_6H_4)$—$S^+Ph_2(PF_6^-)_2$ |
| Esacure 1064 | Lamberti | Mixture of PhS—$(C_6H_4)$—$S^+$-$Ph_2PF_6^-$ and $Ph_2S^+$—$(C_6H_4)$—$S$—$(C_6H_4)$—$S^+Ph_2(PF_6^-)_2$ |
| Irgacure 184 | Ciba Specialty Chemicals | 1-hydroxycyclohexyl phelyl ketone |
| Irganox 1035 | Ciba | Antioxidant and heat stabiliser |

TABLE D III

| | example | | | |
| --- | --- | --- | --- | --- |
| | D1 | D2 | D3 | D4 |
| Epalloy 5000 | | | 48 | 38 |
| Uvacure 1500 | 48 | | 38 | |
| Oxt-101 | 15 | 15 | 15 | 15 |
| SR833 | 30 | 30 | 30 | 30 |
| terathane 1000 | | | 10 | 10 |
| Irgacure 184 | 2 | 2 | 2 | 2 |
| Esacure 1064 | 5 | 5 | 5 | 5 |

TABLE D IV

| | example | | | | | | | | |
| --- | --- | --- | --- | --- | --- | --- | --- | --- | --- |
| | D5 | D6 | D7 | D8 | D9 | D10 | D11 | D12 | D13 |
| Epalloy 5000 | 50 | 50 | 50 | 60 | 58 | 47 | 50 | 50 | 50 |
| Oxt-101 | 15 | 15 | 15 | 18 | 17 | 18 | 15 | 10 | 15 |
| SR833 | 20 | 18 | 28 | 15 | 18 | 28 | 20 | 28 | 20 |
| CN2302 | 3 | 5 | | | | | | | |
| CN2301 | 5 | 5 | | | | | | | |
| CN131 | | | | | | | 8 | | |
| k-flex 188 | | | | | | | | 5 | |
| Irgacure 184 | 2 | 2 | 2 | 2 | 2 | 2 | 2 | 2 | 2 |
| UVI6992 | 5 | 5 | 5 | 5 | 5 | 5 | 5 | 5 | 5 |

TABLE D V

| | | example | | | |
| --- | --- | --- | --- | --- | --- |
| | | D1 | D2 | D3 | D4 |
| Dp | Mil | 5.79 | 5.91 | 5.78 | 4.52 |
| Ec | mJ/cm2 | 10.89 | 12.36 | 14.34 | 17.15 |
| E4 | mJ/cm2 | 21.73 | 24.32 | 28.63 | 41.55 |
| E11 | mJ/cm2 | 72.80 | 79.48 | 96 | 195.45 |
| Tensile modulus | MPa | 2090 | 2375 | 2159 | 383 |
| Elongation to break | % | 3.06 | 3.2 | 3.9 | 18.9 |
| Tensile strength | MPa | 39 | 46 | 45 | 16 |
| Flexural modulus | MPa | 1970 | 1960 | 2280 | 300 |
| Flexural strength | MPa | 61 | 83 | 94 | 21 |
| Fracture toughness (G1C) | J/m2 | 0.38 | 0.61 | 1.143 | 0.51 |
| Stress intensity coefficient (K1C) | MPa√m | 63 | 158 | 501 | 752 |
| HDT at 0.45 MPa | °C. | 55.2 | 50.2 | 54.5 | 38.2 |
| Tg (DMA) | °C. | 71.1 | 63.5 | 61 | 52.6 |

TABLE D VI

| | | example | | | | | | | | |
| --- | --- | --- | --- | --- | --- | --- | --- | --- | --- | --- |
| | | D5 | D6 | D7 | D8 | D9 | D10 | D11 | D12 | D13 |
| Dp | Mil | n/a | n/a | 6.82 | 6.34 | 5.98 | 6.63 | n/a | n/a | n/a |
| Ec | mJ/cm2 | n/a | n/a | 6.41 | 8.45 | 5.86 | 7.38 | n/a | n/a | n/a |
| E4 | mJ/cm2 | n/a | n/a | 11.53 | 15.88 | 11.4 | 13.5 | n/a | n/a | n/a |
| E11 | mJ/cm2 | n/a | n/a | 32.17 | 47.92 | 36.87 | 38.77 | n/a | n/a | n/a |
| Tensile modulus | MPa | 2565 | 2455 | 2420 | 2186 | 2303 | 2358 | 2372 | 2241 | 2392 |
| Elongation to break | % | 8.4 | 6.6 | 11.4 | 10.7 | 6.1 | 11.2 | 6.5 | 8.3 | 10.3 |
| Tensile strength | MPa | 55 | 52 | 52 | 46 | 47 | 51 | 48 | 48 | 50 |
| Flexural modulus | MPa | 2000 | 2400 | 2360 | 1930 | 2100 | 2100 | 2490 | 2160 | 2460 |
| Flexural strength | MPa | 69 | 79 | 80 | 69 | 74 | 71 | 82 | 75 | 80 |
| Notched Izod impact | Ft. lbs/in | 0.61 | 0.62 | 0.71 | 1.0 | 0.80 | 0.73 | 0.78 | 0.79 | 0.85 |

TABLE D VII

| | example | | | | |
|---|---|---|---|---|---|
| | D14 | D15 | D16 | D17 | D18 |
| Uvacure 1500 | 59.4 | 53.46 | 53.46 | 45.45 | 45.45 |
| OXT-101 | | | | 15 | 15 |
| SR 399 | 17 | 15.3 | 15.3 | 13 | 13 |
| SR 495 | | 10 | | 8.5 | |
| SR 306 | | | 10 | | 8.5 |
| Terathane 250 | 18 | 16.2 | 16.2 | 13.77 | 13.77 |
| Irgacure 184 | 2.3 | 2.07 | 2.07 | 1.76 | 1.76 |
| UVI6976 | 3.1 | 2.79 | 2.79 | 2.37 | 2.37 |
| Irganox 1035 | 0.2 | 0.18 | 0.18 | 0.15 | 0.15 |

TABLE D VIII

| | example | | | | |
|---|---|---|---|---|---|
| | D19 | D20 | D21 | D22 | D23 |
| Uvacure 1500 | 59.4 | 53.46 | 53.46 | 45.45 | 45.45 |
| OXT-101 | | | | 15 | 15 |
| SR 399 | 17 | 15.3 | 15.3 | 13 | 13 |
| SR 495 | | 10 | | 8.5 | |
| SR 306 | | | 10 | | 8.5 |
| Terathane 250 | 18 | 16.2 | 16.2 | 13.77 | 13.77 |
| Irgacure 184 | 2.3 | 2.07 | 2.07 | 1.76 | 1.76 |
| Esacure 1064 | 3.1 | 2.79 | 2.79 | 2.37 | 2.37 |
| Irganox 1035 | 0.2 | 0.18 | 0.18 | 0.15 | 0.15 |

Clarity on samples D14-D23 is evaluated by measuring total transmission (ratio of the overall amount of light going through the material to the incident quantity of light. It is reduced by reflexion and transmission. Measurements have been performed on a hazemeter Haze Guard plus (BYK Gardner) on disks samples (0.004 mm thick, and φ 40 mm). Highest clarity is shown by a higher clarity number.

TABLE D IX

| | example | | | | |
|---|---|---|---|---|---|
| | D14 | D15 | D16 | D17 | D18 |
| clarity | 87.1 | 91.1 | 90.8 | 90.8 | 90.5 |

TABLE D X

| | example | | | | |
|---|---|---|---|---|---|
| | D19 | D20 | D21 | D22 | D23 |
| clarity | 82.3 | 88.7 | 86 | 86.8 | 84.5 |

TABLE D XI

| | example | | | |
|---|---|---|---|---|
| | D24 | D25 | D26 | D27 |
| Epalloy 5000 | 43 | 38 | 33 | 28 |
| Oxt-101 | 15 | 15 | 15 | 15 |
| SR833 | 30 | 30 | 30 | 30 |
| Nanopox A610 | 5 | 10 | 15 | 20 |
| Irgacure 184 | 2 | 2 | 2 | 2 |
| Esacure 1064 | 5 | 5 | 5 | 5 |

TABLE D XII

| | example | | | |
|---|---|---|---|---|
| | D28 | D29 | D30 | D31 |
| Epalloy 5000 | 48 | 48 | 48 | 47 |
| Oxt-101 | 15 | 15 | 15 | 15 |
| SR833 | 29.5 | 28 | 26 | 30 |
| Nanobyk 3601 | 0.5 | 2 | 4 | |
| Nanofine | | | | 1 |
| Irgacure 184 | 2 | 2 | 2 | 2 |
| Esacure 1064 | 5 | 5 | 5 | 5 |

TABLE D XIII

| | | example | | | |
|---|---|---|---|---|---|
| | | D24 | D25 | D26 | D27 |
| Dp | Mil | 5.81 | 5.57 | 5.84 | 5.56 |
| Ec | mJ/cm2 | 11.65 | 10.67 | 11.54 | 10.82 |
| E4 | mJ/cm2 | 23.20 | 21.87 | 22.90 | 22.21 |
| E11 | mJ/cm2 | 77.49 | 76.78 | 75.93 | 78.16 |
| Tensile modulus | MPa | 1540 | 1570 | 1730 | 2210 |
| Elongation to break | % | 3 | 3.1 | 2.9 | 2.9 |
| Tensile strength | MPa | 28 | 30 | 31 | 39 |
| Flexural modulus | MPa | 1240 | 1665 | 1760 | 2050 |
| Flexural strength | MPa | 50 | 64 | 60 | 63 |
| Fracture toughness (G1C) | J/m2 | 0.64 | 0.55 | 0.70 | 0.40 |
| Stress intensity coefficient (K1C) | MPa√m | 280 | 162 | 232 | 70 |
| HDT at 0.45 MPa | ° C. | 45.4 | 45.6 | 45.6 | 48.8 |

TABLE D XIV

| | | example | | | |
|---|---|---|---|---|---|
| | | D28 | D29 | D30 | D31 |
| Dp | Mil | 6.29 | 6.22 | 5.67 | 6.39 |
| Ec | mJ/cm2 | 13.83 | 15.69 | 15.28 | 15.3 |
| E4 | mJ/cm2 | 26.13 | 29.85 | 30.95 | 28.60 |
| E11 | mJ/cm2 | 79.55 | 92.00 | 106.49 | 85.49 |
| Tensile modulus | MPa | 2380 | 2170 | 1340 | 1940 |
| Elongation to break | % | 2.9 | 3.0 | 3.0 | 2.3 |
| Tensile strength | MPa | 45 | 42 | 26 | 31 |
| Flexural modulus | MPa | 2135 | 1720 | 1000 | 1380 |
| Flexural strength | MPa | 68 | 48 | 31 | 39 |
| Fracture toughness (G1C) | J/m2 | 1.151 | 1.186 | 0.551 | 0.77 |
| Stress intensity coefficient (K1C) | MPa√m | 539 | 695 | 260 | 330 |
| HDT at 1.80 MPa | ° C. | 43.4 | 41.7 | 39 | 41.7 |

EXAMPLE E

Test specimens of formulation B6 have been fabricated on a SLA350 and conditionned at 23° C., 50 to 60% RH. Impact strength values given are average over 10 specimens.

The table below reports the evolution of impact strength over a period of over 5 months. This is a tremendous result, as it is well known that currently commercially available SL resins produce parts that undergo dark cure over time, and loose impact resistance within weeks of being fabricated.

TABLE E

|  | | 5 days | 30 days | 159 days |
|---|---|---|---|---|
| Notched izod impact strength | Ft. lbs/in | 0.93 | 0.91 | 0.92 |

EXAMPLES F

Suitable jettable compositions are shown in table F1. These compositions have a viscosity of 10 to 12 cps at 70° C. and are stable jettable using the SPECTRA NOVAJET device; they have reasonable sensitivity and good jettable properties. More details on jettable formulations can be found in WO 03/09947 A1, the content of which is incorporated herein by reference. Preferably, the jettable composition is a fully curable jettable composition having a viscosity less than 30 cps at a temperature within the range of 15-180 C, more preferably at a temperature of 15-100 C, e.g. 60-80 C, which composition comprises:

(A) at least one low viscosity reactive resin selected from the group consisting of compounds containing an oxetane ring, cycloaliphatic epoxy resins, tetrahydrofurans, hexahydropyrans and mono-functional (meth)acrylates, preferably said resin having a molecular weight of not greater than 300 Daltons, e.g. 250 Daltons or less, and preferably a viscosity at a temperature in the said range of less than 30 cps, e.g. 5 to 15 cps;

(B) at least one higher viscosity resin selected from the group consisting of epoxy resins, compounds containing an oxetane ring and acrylates, which resin acts to thicken the low viscosity resin and strengthen a jetted deposit of the composition, the higher viscosity resin having: a viscosity greater than twice that of the low viscosity resin at the said temperature in the range stated above, and a functionality of greater than or equal to 2;

(C) optionally, at least one curable toughener, preferably having a functionality of at least 2, such as hydroxy, epoxy, acrylate or other reactive functionalised polymer oligomer (e.g. derived by functionalising, poly(tetrahydrofuran), polycaprolactone, polycarbonate diol, or a dendrimeric polyol;

(D) at least one initiator for the polymerisation of the resins, and (E) optionally at least one stabiliser for delaying the curing of the resins of the composition; wherein the low viscosity resin is slower to react than the higher viscosity resin and acts to solvate the higher viscosity resin prior to curing and at least partly during curing and wherein at least 30% of the components A and B are cationically curable resins.

The compositions can be jetted from piezo electric printing heads under the control of a computer program to form a multi-layered article, e.g. a three dimensional article, in which the adjacent droplets merge and are cured homogeneously together

TABLE F1

|  | F1 | F2 | F3 | F4 |
|---|---|---|---|---|
| UV1500 | 50 | 51.5 | 50 | 47 |
| UVR6000 | 45 | 46 | 45 | 43 |
| UVI6976 | 5 | 2.5 | | |
| UVI6992 | | | 5 | 10 |

Cure speed of jetted compositions F1 to F4 (table F1) have been measured to be as follows:

50 seconds for 2.5% UVI6976 (F2); 40 seconds for 5% UVI6976 (F1); 75 seconds for 5% UVI6992 (F3); and 40 seconds for 10% UVI6992 (F4).

Aging tests at 60° C. have been performed. A number of formulations were subjected to this testing (table F2). As shown in this disclosure, formulations using PF6 salts are more stable than formulations containing SbF6 salts, while having similar cure speeds.

TABLE F2

|  | F5 | F6 | F7 | F8 | F9 | F10 | F11 | F12 | F13 |
|---|---|---|---|---|---|---|---|---|---|
| UV1500 | 95 | | | 50 | | | | | |
| UVR6105 | | 95 | | | | 50 | 50 | 95 | 90 |
| UVR6107 | | | 95 | | | | | | |
| UVR6128 | | | | | | | | | 95 |
| UVR6000 | | | | 45 | 45 | 45 | | | |
| UVR6976 | 5 | 5 | 5 | 5 | 5 | | | | 5 |
| UVR6992 | | | | | | 5 | 5 | 10 | |

TABLE F3

| Formulation | Initial Viscosity/mPa·s | 1 week @ 60° C./mPa·s |
|---|---|---|
| F5 | 220 | 900 |
| F6 | 160 | 5100 |
| F7 | 290 | 410 |
| F8 | 50 | Solid |
| F9 | 50 | Solid |
| F10 | 25 | 85 |
| F11 | 128 | 138 |
| F12 | 205 | 225 |
| F13 | 590 | 650 |

What is claimed is:

1. A photocurable composition comprising:
   (a) 35-80% by weight of a cationically curable component;
   (b) 15-60% by weight of a free radically active component;
   (c) 0.1-10% by weight of an antimony-free cationic photoinitiator;
   (d) 0-10% by weight of a free radical photoinitiator; and
   (e) 0-40% by weight of one or more toughening agents
wherein the percent by weight is based on the total weight of the photocurable composition, the free radically active component comprises at least one dendritic polymer acrylate compound, and the photocurable composition has a viscosity of less than 500 cps.

2. The photocurable composition of claim 1 wherein the free radically active component comprises a poly(meth)acrylate.

3. The photocurable composition of claim 2 wherein the poly(meth)acrylate comprises a difunctional acrylate compound.

4. The photocurable composition of claim 2 wherein the free radically active component further comprises an epoxy functionalized compound.

5. The photocurable composition of claim 1 wherein the cationically curable component comprises a hydrogenated bisphenol epoxy-containing compound.

6. The photocurable composition of claim 5 wherein the cationically curable component further comprises an oxetane compound.

7. The photocurable composition of claim 1 wherein the antimony-free cationic photoinitiator is a triarylsulfonium hexafluorophosphate salt.

8. The photocurable composition of claim 1 wherein the photocurable composition comprises 0.01-40% by weight of one or more toughening agents.

9. The photocurable composition of claim 8 wherein the toughening agent comprises reactive particles comprising a polysiloxane core and a shell containing reactive groups.

10. The photocurable composition of claim 1 wherein the photocurable composition has a viscosity in the range of 50-500 cps.

11. The photocurable composition of claim 1 wherein the photocurable composition, after cure by exposure to actinic radiation and optionally heat, has a notched izod impact between 0.6 ft. lbs/in and 1.1 ft. lbs/in.

12. The photocurable composition of claim 1 wherein the photocurable composition, after cure by exposure to actinic radiation and optionally heat, has a notched izod impact of at least 0.6 ft. lbs/in.

13. A photocurable composition comprising:
   (a) 35-80% by weight of a cationically curable component;
   (b) 1 5-60% by weight of a free radically active component comprising (i) at least one poly(meth)acrylate compound and (ii) at least one dendritic polymer acrylate compound;
   (c) 0.1-10% by weight of an antimony-free cationic photoinitiator;
   (d) 0-10% by weight of a free radical photoinitiator;
   (e) 0-40% by weight of one or more toughening agents
   wherein the percent by weight is based on the total weight of the photocurable composition and wherein the photocurable composition, after cure by exposure to actinic radiation and optionally heat has at least one of a tensile strength of at least 30 MPa, a flexural modulus within the range from about 1000-2300 MPa, a notched izod impact of at least 0.6 ft, lbs/in, and/or an average elongation at break of at least 5%.

14. The photocurable composition of claim 13 wherein the photocurable composition comprises 0.01-40% by weight of one or more toughening agents and the photocurable composition, after cure by exposure to actinic radiation and optionally heat, has a notched izod impact of at least 0.6 ft. lbs/in.

15. The photocurable composition of claim 13 wherein the poly(meth)acrylate comprises a difunctional acrylate compound.

16. The photocurable composition of claim 13 wherein the free radically active component further comprises an epoxy functionalized compound.

17. The photocurable composition of claim 13 wherein the cationically curable component comprises a hydrogenated bisphenol epoxy-containing compound.

18. The photocurable composition of claim 17 wherein the cationically curable component further comprises an oxetane compound.

19. The photocurable composition of claim 13 wherein the photocurable composition comprises 0.01-40% by weight of one or more toughening agents.

20. A process for producing a non-toxic photocurable composition comprising mixing together
   (a) 35-80% by weight of a cationically curable component;
   (b) 15-60% by weight of a free radically active component comprising (i) at least one poly(meth)acrylate compound and (ii) at least one dendritic polymer acrylate compound;
   (c) 0.1-10% by weight of an antimony-free cationic photoinitiator;
   (d) 0-10% by weight of a free radical photoinitiator; and optionally
   (e) 0-40% by weight of one or more toughening agents, wherein the photocurable composition has a viscosity of less than 500 cps.

21. A process for producing an antimony-free three dimensional article comprising:
   (a) forming a first layer of the photocurable composition of claim 1 on a surface;
   (b) exposing the layer imagewise to actinic radiation to form an imaged cross-section, wherein the radiation is of sufficient intensity to cause substantial curing of the layer in the exposed areas;
   (c) forming a second layer of the composition of claim 1 on the previously exposed imaged cross-section;
   (d) exposing the second layer from step (c) imagewise to actinic radiation to form an additional imaged cross-section, wherein the radiation is of sufficient intensity to cause substantial curing of the second layer in the exposed areas and to cause adhesion to the previously exposed imaged cross-section; and
   (e) repeating steps (c) and (d) a sufficient number of times in order to build up the three-dimensional article.

22. The process of claim 21 wherein the photocurable composition comprises 0.01-40% by weight of one or more toughening agents, preferably a toughening agent comprising reactive particles having a polysiloxane core and a shell containing reactive groups.

23. The process of claim 22 wherein the photocurable composition has a viscosity in the range of 50-500 cps.

24. A three-dimensional medical article produced according to the process of claim 21.

25. The three-dimensional medical article of claim 24 wherein the medical article is a medical device, medical model or medical implant, successfully meeting the requirements of USP 28, NF 23, for the biological tests for plastics, class VI, 70° C.

26. An antimony-free three-dimensional article produced by the process of claim 21.

27. A process for producing a three dimensional article by jet printing comprising the steps of:
   (a) applying successive droplets of the photocurable composition of claim 1 at targeted locations on a substrate in accordance with a desired shape stored on a computer file;
   (b) exposing the droplets to electromagnetic radiation to cure the droplets in the exposed areas;
   (c) repeating steps (a) and (b) a sufficient number of times in order to build up the three dimensional article.

28. The process of claim 27 wherein the substrate comprises paper, textiles, tiles, printing plates, wallpaper, plastic, powder, paste or a reactive resin, liquid or already partly cured.

29. The process of claim 27 wherein the photocurable composition is exposed to electromagnetic radiation pixel by pixel, line by line, layer by layer, after several layers have been formed, and/or after all layers have been formed.

30. The process of claim 27 wherein the electromagnetic radiation employed is UV light, microwave radiation, visible light, or laser beams.

* * * * *